US011983605B2

(12) United States Patent
Bravyi et al.

(10) Patent No.: US 11,983,605 B2
(45) Date of Patent: May 14, 2024

(54) PARTITIONED TEMPLATE MATCHING AND SYMBOLIC PEEPHOLE OPTIMIZATION

(71) Applicant: International Business Machines Corporation, Armonk, NY (US)

(72) Inventors: Sergey Bravyi, Ossining, NY (US); Shaohan Hu, Yorktown Heights, NY (US); Dmitri Maslov, New Canaan, CT (US); Ruslan Shaydulin, Anderson, SC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 810 days.

(21) Appl. No.: 17/082,844

(22) Filed: Oct. 28, 2020

(65) Prior Publication Data
US 2022/0129411 A1 Apr. 28, 2022

(51) Int. Cl.
*G06N 10/20* (2022.01)
*G06F 30/323* (2020.01)
(Continued)

(52) U.S. Cl.
CPC .......... *G06N 10/20* (2022.01); *G06F 30/323* (2020.01); *G06N 10/00* (2019.01);
(Continued)

(58) Field of Classification Search
CPC ........ G06N 10/20; G06N 10/00; G06N 10/80; G06F 30/323; G06F 30/3308; G06F 30/337; G06F 30/367; G06F 30/398
(Continued)

(56) References Cited

U.S. PATENT DOCUMENTS

| 10,242,321 B2 | 3/2019 | Bocharov et al. |
| 10,404,287 B2 | 9/2019 | Haah et al. |

(Continued)

FOREIGN PATENT DOCUMENTS

WO 2019204678 10/2019

OTHER PUBLICATIONS

Chow, "Quantum Information Processing with Superconducting Qubits", Yale University, May 2010, 322 pages. (Year: 2010).*

(Continued)

*Primary Examiner* — Phallaka Kik
(74) *Attorney, Agent, or Firm* — Amin, Turocy & Watson, LLP

(57) ABSTRACT

Systems and techniques that facilitate partitioned template matching and/or symbolic peephole optimization are provided. In various embodiments, a system can comprise a template component, which can perform template matching on a Clifford circuit associated with a set of qubits. In various aspects, the system can comprise a partition component, which can partition, prior to the template matching, the Clifford circuit into a computation stage, a Pauli stage, and a SWAP stage. In various instances, the template matching can be performed on the computation stage. In various embodiments, the system can comprise a symbolic component, which can select a subset of qubits from the set of qubits, rewrite at least one entangling gate in the computation stage such that a target of the at least one entangling gate is in the subset of qubits, and replace the at least one rewired entangling gate with a symbolic Pauli gate. In various cases, the symbolic Pauli gate can be a Pauli gate that is controlled by a symbolic variable. In various aspects, the system can comprise a peephole component, which can perform peephole optimization on the subset of qubits with the symbolic (Continued)

Pauli gate by implementing a dynamic programming algorithm.

20 Claims, 24 Drawing Sheets

(51) Int. Cl.
  *G06F 30/3308* (2020.01)
  *G06F 30/337* (2020.01)
  *G06F 30/367* (2020.01)
  *G06F 30/398* (2020.01)
  *G06N 10/00* (2022.01)
  *G06N 10/80* (2022.01)

(52) U.S. Cl.
  CPC ........ *G06F 30/3308* (2020.01); *G06F 30/337* (2020.01); *G06F 30/367* (2020.01); *G06F 30/398* (2020.01); *G06N 10/80* (2022.01)

(58) Field of Classification Search
  USPC ............. 716/105, 103, 111, 132, 30; 703/15
  See application file for complete search history.

(56) References Cited

U.S. PATENT DOCUMENTS

| | | | |
|---|---|---|---|
| 10,599,989 | B2 | 3/2020 | Bravyi et al. |
| 11,144,689 | B1* | 10/2021 | Cowtan ................. G06F 30/327 |
| 11,748,648 | B2* | 9/2023 | Gambetta .............. G06N 10/00 |
| | | | 706/62 |
| 2017/0220948 | A1 | 8/2017 | Bocharov et al. |
| 2018/0276014 | A1 | 9/2018 | Kliuchnikov et al. |
| 2020/0134107 | A1 | 4/2020 | Low et al. |
| 2021/0272000 | A1* | 9/2021 | van den Berg ......... G06F 17/16 |
| 2022/0114468 | A1* | 4/2022 | Bravyi .................... G06N 10/20 |
| 2022/0188381 | A1* | 6/2022 | Mezzacapo ............ G06N 10/60 |
| 2023/0237361 | A1* | 7/2023 | Cowtan .................... G06N 5/01 |
| | | | 706/62 |

OTHER PUBLICATIONS

Harrow, "Clifford Group" Quantum Information Science II Lecture 6, https://web.mit.edu/8.371/www/lectures/lect06.pdf, Feb. 26, 2018, 5 pages. (Year: 2018).*
Tran et al., "Optimizing Clifford gate generation for measurement-only topological quantum computation with Majorana zero modes", SciPost. Phys. 8, Jun. 24, 2020, pp. 1-71. (Year: 2020).*
Zeng, "Quantum Operations and Codes Beyond the Stabilizer-Clifford Framework", Massachusetts Institute of Technology, Jun. 2009, pp. 1-196. (Year: 2009).*
Mell et al., "The NIST Definition of Cloud Computing," Recommendations of the National Institute of Standards and Technology, NIST Special Publication 800-145, Sep. 2011, 7 pages.
Kliuchnikov et al., "Optimization of Clifford Circuits," Phys. Rev. A 88, 052307, arXiv:1305.0810 [quant-ph], 2013, 8 pages.
Fagan et al., "Optimising Clifford Circuits with Quantomatic," 15th International Conference on Quantum Physics and Logic, EPTCS 287, arXiv:1901.10114 [quant-ph], 2019, pp. 85-105, 21 pages.
Maslov et al., "Quantum Circuit Simplification and Level Compaction," IEEE Transactions on Computer-Aided Design of Integrated Circuits and Systems, 2008, 14 pages.
Prasad et al., "Data Structures and Algorithms for Simplifying Reversible Circuits," ACM Journal on Emerging Technologies in Computing Systems, Oct. 2006, 19 pages.
Duncan, "Clifford-Quanto," https://gitlab.cis.strath.ac.uk/kwb13215/Clifford-Quanto/, Last accessed on Oct. 22, 2020, 1 page.
Aaronson et al., "Improved simulation of stabilizer circuits," Physical Review A, 70(5), Nov. 2004, 15 pages.
Bravyi et al., "Hadamard-free circuits expose the structure of the clifford group," arXiv:2003.09412 [quant-ph], 2020, 34 pages.
Cleve et at, "Efficient computations of encodings for quantum error correction," Physical Review A, 56(1):76-82, Jul. 1997, 16 pages.
Grassl, "Encoding Circuits for Quantum Error-Correcting Codes," http://markus-grassl.de/QECC/circuits/, 2007, 2 Pages.
Iten et al., "Exact and practical pattern matching for quantum circuit optimization," arXiv:1909.05270v2 [quant-ph], 2019, 43 pages.
Maslov et al., "Fredkin/toffoli templates for reversible logic synthesis," International Conference on Computer Aided Design, 2003, 7 pages.
Maslov et al., "Simplification of toffoli networks via templates," 16th Symposium on Integrated Circuits and Systems Design, 2003, 7 pages.
Maslov et al., "Synthesis of fredkin-toffoli reversible networks," IEEE Transactions on Very Large Scale Integration (VLSI) Systems, 13(6):765-769, Jun. 2005, 6 pages.
Miller et al., "A transformation based algorithm for reversible logic synthesis," Proceedings of the 40th conference on Design automation—DAC '03. ACM Press, 2003, 6 pages.
Nielsen et al., "Quantum computation and quantum information," Cambridge University Press, 2002, 710 pages.
Patel et al., "Optimal synthesis of linear reversible circuits," Quantum Info. Comput., 8(3):282-294, 2008, 9 pages.
Rahman et al., "An algorithm for quantum template matching," ACM Journal on Emerging Technologies in Computing Systems, 11(3):1-20, Dec. 2014, 20 pages.
International Search Report and Written Opinion received for PCT Application Serial No. PCT/EP2021/079583 dated May 10, 2022, 20 pages.
Bravyi et al., "Clifford Circuit Optimization with Templates and Symbolic Pauli Gates", arXiv:2105.02291v2 [quant-ph], May 5, 2021, 16 pages.
Response to the Communication pursuant to Rules 161(1) and 162 EPC received for European Patent Application Serial No. EP21819020.6 dated Nov. 17, 2023, 2 pages.

* cited by examiner

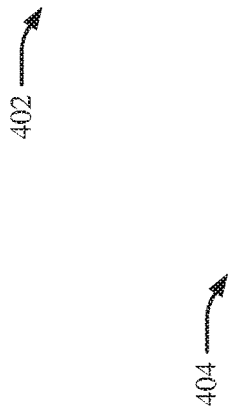

| Case | A | B | C | D | E |
|---|---|---|---|---|---|
| $O_1$ | X | X | X | 1 | 1 |
| $O'_1$ | Z | X | 1 | Z | 1 |

Algorithm 1 Decoupling circuit

1: if $1 \notin A$ then
2: $\quad$ SWAP$_{1,A(1)}$
3: end if
4: for $j \in C$ do
5: $\quad$ CNOT$_{1,j}$
6: end for
7: for $j \in D$ do
8: $\quad$ CNOT$_{j,1}$
9: end for
10: $i \leftarrow$ first qubit of $B$
11: for $j \in B \setminus \{i\}$ do
12: $\quad$ CNOT$_{i,j}$
13: end for
14: CNOT$_{i,1}$H$_i$CNOT$_{1,i}$
15: $k \leftarrow (|A| - 1)/2$
16: for $j = 1$ to $k$ do
17: $\quad$ CNOT$_{A(2j+1),A(2j)}$
18: $\quad$ CNOT$_{A(2j),A(1)}$
19: $\quad$ CNOT$_{A(1),A(2j+1)}$
20: end for

$\triangleright$ Now $O_1 = X$ and $O'_1 = Z$
$\triangleright$ Clean $O$ from $C$ $\triangleright$ Clean $O'$ from $D$ $\triangleright$ Clean $O, O'$ from $B \setminus \{i\}$ $\triangleright$ Clean $O, O'$ from $i$ $\triangleright$ Clean $O, O'$ from $A \setminus \{1\}$

FIG. 4

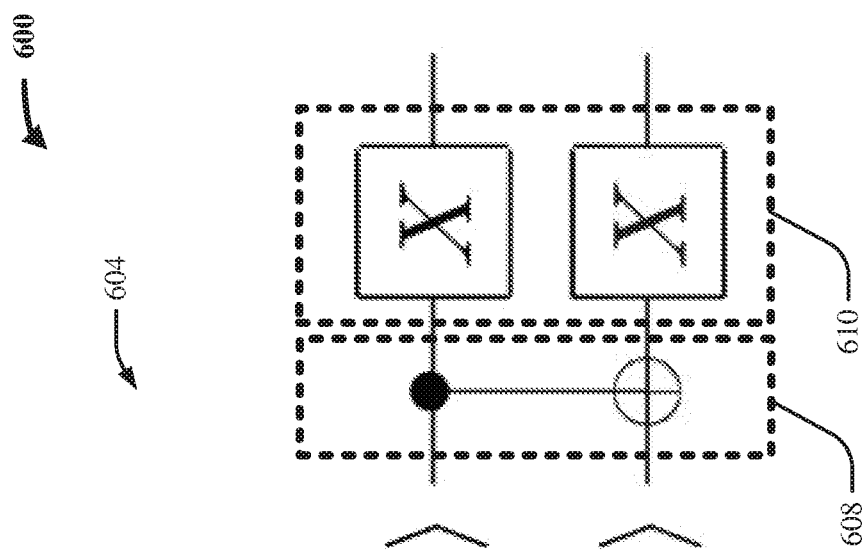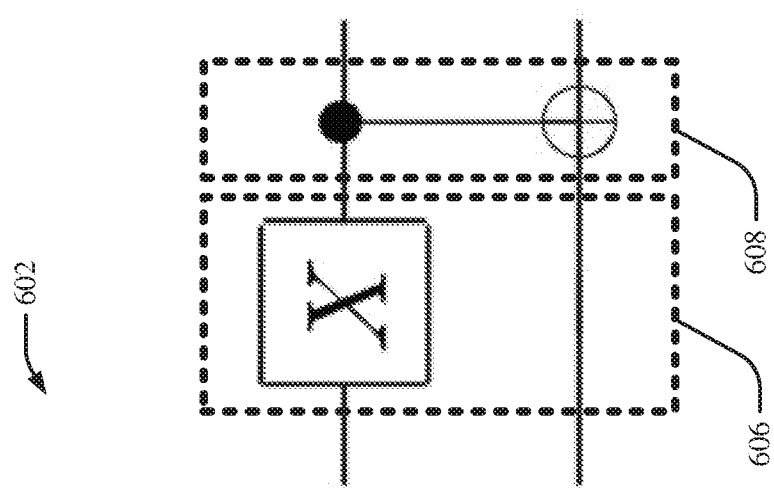
FIG. 6

1202

| $O_1$ | $O_2$ | Result |
|---|---|---|
| I | I | I |
| I | X | $S^\dagger HS^\dagger = SZHSZ$ |
| I | Y | HZ |
| I | Z | S |
| I | -X | SHS |
| I | -Y | ZH |
| I | -Z | XSX |

1204

| $O_1$ | $O_2$ | Result |
|---|---|---|
| X | X | X |
| X | Y | $XS^\dagger = XSZ$ |
| X | Z | H |
| Y | Y | Y |
| Y | Z | $SHS^\dagger = SHSZ$ |
| Z | Z | Z |
| X | -Y | $S^\dagger X = SZX$ |
| X | -Z | ZHZ |
| Y | -Z | $S^\dagger HS = SZHS$ |

FIG. 12

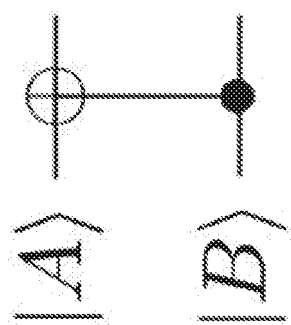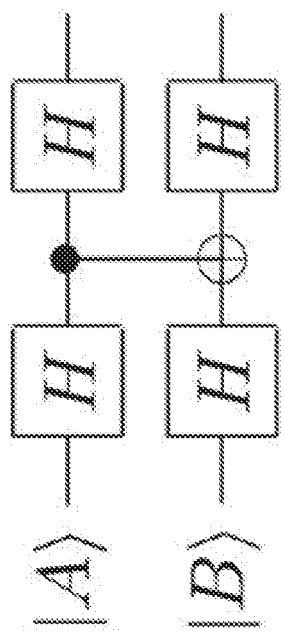
FIG. 17

PARTITIONED TEMPLATE MATCHING AND SYMBOLIC PEEPHOLE OPTIMIZATION

BACKGROUND

The subject disclosure relates to Clifford circuits, and more specifically to partitioned template matching and symbolic peephole optimization for Clifford circuits.

Quantum circuits are transformations that operate on a set of qubits. Quantum circuits can be represented by unitary matrices (e.g., a quantum circuit operating on n qubits for any suitable positive integer n can be represented by a $2^n \times 2^n$ unitary matrix). The quantum state of a set of qubits can be represented by a quantum state vector (e.g., for n qubits, a quantum state vector can have $2^n$ elements), and quantum circuits can be applied to a quantum state vector via matrix multiplication. Quantum circuits can be combined in series via matrix multiplication and/or can be combined in parallel via tensor products (e.g., Kronecker products).

The long-term success of quantum computing depends on achieving at least partial fault-tolerance. Clifford circuits are a particular type of quantum circuit that are integral to fault-tolerant quantum computation (e.g., after all, the encoding circuits for many quantum error-correcting codes are Clifford circuits). Because Clifford circuits can be so useful in quantum computing, synthesis of optimized Clifford circuits implementing a given Clifford operator can be desired. Optimization of a Clifford circuit aims to reduce the single-qubit and/or two-qubit gate count in the Clifford circuit so that the computation time and/or computational resources needed to execute the Clifford circuit can be reduced.

Much study has been performed on the synthesis of asymptotically optimized Clifford circuits (e.g., Clifford circuits that are optimal up to a constant factor, and thus that are not exactly optimal). Conventionally, synthesis of exactly optimized Clifford circuits is prohibitively expensive even for small numbers of qubits (e.g., conventional techniques can generate exactly optimized Clifford circuits only for up to four qubits, and can generate optimized Clifford circuits up to input/output permutations for up to five qubits). Conventional techniques for optimizing Clifford circuits include template matching and peephole optimization. Template matching involves leveraging templates (e.g., a string of gates known to equate to identity) to reduce gate counts in a given circuit. Conventional template matching is a general technique that works with Clifford circuits and non-Clifford circuits alike. Thus, conventional template matching does not leverage and/or make use of the particular structural characteristics of Clifford circuits, and this limits the extent to which the circuits can be optimized. Peephole optimization involves identifying a subcircuit in an overall Clifford circuit and utilizing a library of known optimal circuits to optimize the subcircuit. A technical problem with conventional peephole optimization is that it requires the subcircuit to be completely isolated from the rest of the Clifford circuit. In other words, if the subcircuit contains entangling gates that link the subcircuit to the rest of the circuit, conventional peephole optimization cannot be used.

Systems and/or techniques that can ameliorate and/or solve one or more of these technical problems can be desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that can facilitate partitioned template matching and symbolic peephole optimization for Clifford circuits are described.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise a template component, which can perform template matching on a Clifford circuit associated with a set of qubits. In various aspects, the computer-executable components can further comprise a partition component, which can partition, prior to the template matching, the Clifford circuit into a computation stage, a Pauli stage, and a SWAP stage. In various instances, the template matching can be performed on the computation stage. In various embodiments, the computer-executable components can further comprise a symbolic component, which can select a subset of qubits from the set of qubits, rewrite at least one entangling gate in the computation stage such that a target of the at least one entangling gate is in the subset of qubits, and replace the at least one rewired entangling gate with a symbolic Pauli gate. In various cases, the symbolic Pauli gate can be a Pauli gate that is controlled by a symbolic variable. In various aspects, the computer-executable components can further comprise a peephole component, which can perform peephole optimization on the subset of qubits with the symbolic Pauli gate by implementing a dynamic programming algorithm.

According to one or more embodiments, the above-described system can be implemented as a computer-implemented method and/or computer program product.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise a peephole component, which can perform peephole optimization on a Clifford circuit associated with a set of qubits. In various instances, the computer-executable components can further comprise a symbolic component that can, prior to the peephole optimization, select a subset of qubits from the set of qubits, rewire at least one entangling gate in the Clifford circuit such that a target of the at least one entangling gate is in the subset of qubits, and replace the at least one rewired entangling gate with a symbolic Pauli gate. In various aspects, the computer-executable components can further comprise a partition component, which can partition the Clifford circuit into a computation stage, a Pauli stage, and a SWAP stage. In various cases, the computer-executable components can further comprise a template component, which can perform, prior to rewiring the at least one entangling gate, template matching on the computation stage.

According to one or more embodiments, the above-described system can be implemented as a computer-implemented method and/or computer program product.

DESCRIPTION OF THE DRAWINGS

FIG. 4 illustrates an example, non-limiting table and an example, non-limiting compiling algorithm in accordance with one or more embodiments described herein.

FIG. 6 illustrates, in an exemplary, non-limiting way, how a Pauli gate can be pushed to an end of a Clifford circuit in accordance with one or more embodiments described herein.

FIG. 12 illustrates exemplary, non-limiting rules for converting Pauli operators back into Hadamard and/or Phase gates after floating gate pushing in accordance with one or more embodiments described herein.

FIG. 17 illustrates, in an exemplary, non-limiting way, how a straddling gate can be rewired in accordance with one or more embodiments described herein.

DETAILED DESCRIPTION

Figure 1:
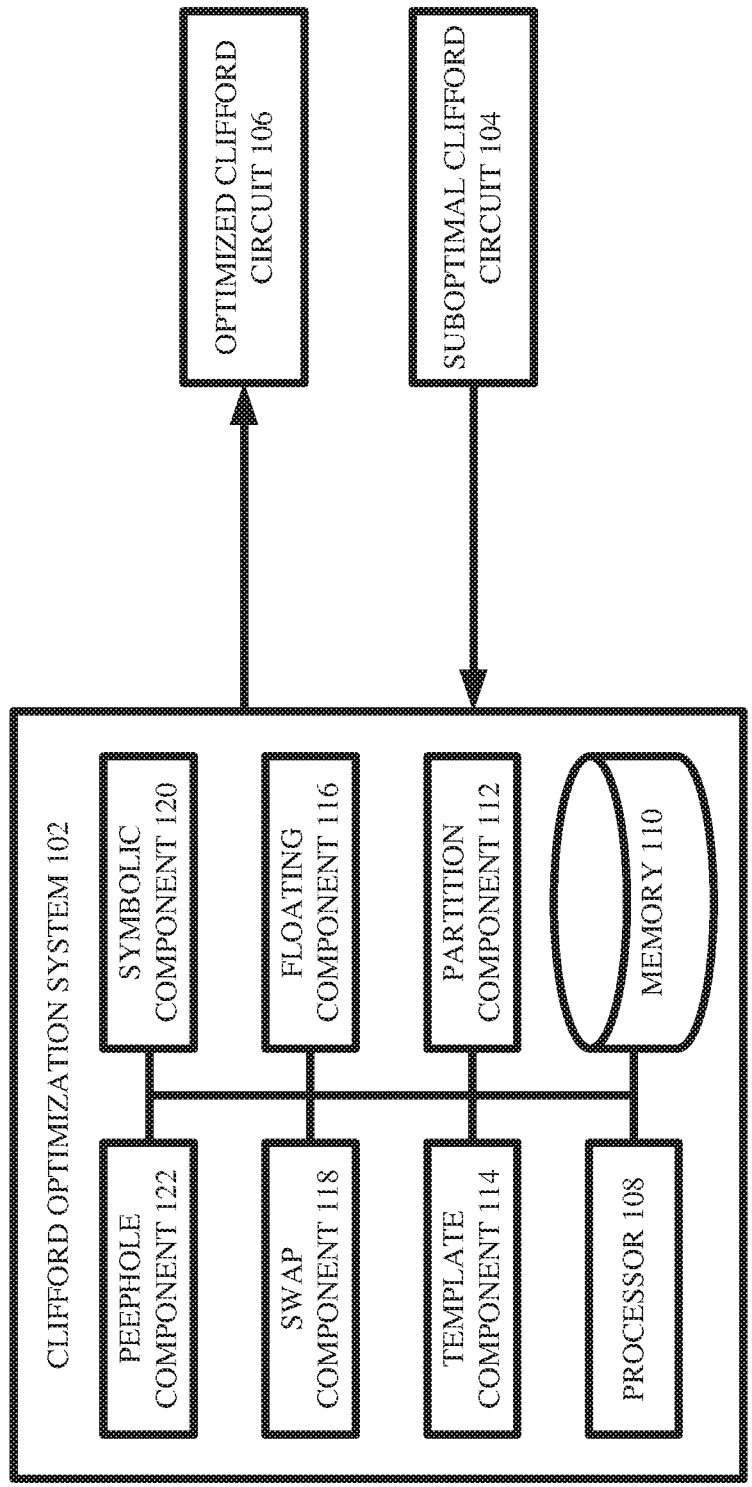
FIG. 1 illustrates a block diagram of an example, non-limiting system that facilitates partitioned template matching and/or symbolic peephole optimization in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As mentioned above, quantum circuits are transformations that operate on a set of qubits. A quantum circuit operating on n qubits, for any suitable positive integer n, can be represented by a $2^n \times 2^n$ unitary matrix. The quantum state of a set of n qubits can be represented by a vector having $2^n$ elements. The quantum circuit can be applied to the quantum state vector via matrix multiplication. Moreover, quantum circuits can be combined in series via matrix multiplication and/or can be combined in parallel via tensor products (e.g., Kronecker products).

As explained above, Clifford circuits are an important type of quantum circuit (e.g., important for achieving quantum fault tolerance). Thus, improved optimization techniques for Clifford circuits can be desirable, where optimization involves reducing the gate count of a given Clifford circuit without changing the overall function/transformation implemented by the given Clifford circuit.

Clifford circuits, also known as stabilizer circuits, can be composed of Hadamard gates (H), Phase gates (S, also known as P), Controlled NOT gates (CNOT), and Pauli gates (X, Y, and Z), where:

$$H = \frac{1}{\sqrt{2}}\begin{bmatrix} 1 & 1 \\ 1 & -1 \end{bmatrix}; P = S = \begin{bmatrix} 1 & 0 \\ 0 & i \end{bmatrix}; CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix};$$

-continued $$X = \begin{bmatrix} 0 & 1 \\ 1 & 0 \end{bmatrix}; Y = \begin{bmatrix} 0 & -i \\ i & 0 \end{bmatrix}; Z = \begin{bmatrix} 1 & 0 \\ 0 & -1 \end{bmatrix}$$

where $i=\sqrt{-1}$. Clifford circuits can also include the identity matrix (I). Another often considered gate is the Controlled Z gate (CZ), which can be constructed as a combination of Hadamard gates and CNOT:

$$CZ = (I \otimes H) * CNOT * (I \otimes H) = \begin{bmatrix} 1 & 0 & 0 & 0 \\ 0 & 1 & 0 & 0 \\ 0 & 0 & 1 & 0 \\ 0 & 0 & 0 & -1 \end{bmatrix}$$

where * represents matrix multiplication, and where ⊗ represents a tensor product.

An important property of Clifford circuits is that Clifford gates H, S, and CNOT can map Pauli matrices (and/or the tensor products of Pauli matrices) into themselves by conjugation. Equivalently, this can be written as Pauli gates being "pushed" through such Clifford gates H, S, and CNOT. That is, $HX=ZH; HY=-YH; HZ=XH; SX=YS; SY=-XS;$
$SZ=ZS \; CNOT_{1,2}X_1=X_1X_2CNOT_{1,2}; \; CNOT_{1,}$
$_2X_2=X_2CNOT_{1,2}; \; CNOT_{1,2}Z_2=Z_1Z_2CNOT_{1,2};$
$CNOT_{1,2}Z_1=Z_1CNOT_{1,2}$ where the indices define control and target qubits. For ease of explanation, these equations can be referred to as Pauli-push equations. As shown in each of these Pauli-push equations, a given Pauli gate implemented on a left side of a Clifford gate is equivalent to some potentially different Pauli gate implemented on the right side of the same Clifford gate. Thus, Paulis can be "pushed" from one side of a Clifford gate to the other.

As mentioned above, optimization of Clifford circuits is conventionally performed via template matching and peephole optimization. These are briefly described below.

First, consider template matching. A size m template, for any suitable positive integer m, is a sequence of m gates which realizes the identity function:

$T=G_0G_1 \ldots G_{m-1}=I$ where T represents the template, and where $G_j$ represents a gate for all non-negative integers j.

To see how templates can be used to reduce gate count, observe that if some subsequence $G_j \ldots G_{j+p-1(mod\ m)}$ of the template is matched with gates in a circuit for some index j and for some $0 \leq p \leq m$, and if the gates in the circuit can be moved together (e.g., made consecutive), then these gates in the circuit can be replaced with the inverse of the other m–p gates of the template. Note that the larger the length p of the sequence, the more beneficial it is to perform the replacement, and for any $$p > \frac{m}{2},$$

the gate count is reduced. The exact criteria for the application of the template can depend on the choice of the objective function (e.g., can depend how circuit cost is measured, such as in circuit depth, in 2-qubit gate count, in total gate count). More formally, for a parameter p where $$\frac{m}{2} \leq p \leq m,$$

the template T can be applied in two directions as follows:

Forward: $G_jG_{j+1(mod\ m)} \cdots G_{j+p-1(mod\ m)} \rightarrow G_{j-1(mod\ m)}^{\dagger}G_{j-2(mod\ m)}^{\dagger} \cdots G_{j+p(mod\ m)}^{\dagger}$ Backward: $G_j^{\dagger}G_{j-1(mod\ m)}^{\dagger} \cdots G_{j-p+1(mod\ m)}^{\dagger} \rightarrow G_{j+1(mod\ m)}G_{j+2(mod\ m)} \cdots G_{j-p(mod\ m)}$ where † represents the adjoint (e.g., conjugate transpose). Note that the adjoint of a unitary matrix/gate is equal to the inverse of the unitary matrix/gate.

In various cases, a template T of size m can be independent of smaller size templates (e.g., an application of a smaller template cannot decrease the number of gates in T or make it equal to another template). Circuit optimization using template matching is an iterative procedure where, at each step, the optimization starts with a given gate in the circuit and it is attempted to match a given template as far backward and/or forward as possible. If the matched gates can be moved together and the substitution is beneficial, the template can be applied as defined above. However, if the matched gates cannot be moved together and/or cannot otherwise be made consecutive, the template cannot be applied. If the matched gates are not consecutive, it can be said that there is at least one blocking gate between the matched gates. Equivalently, it can be said that there is at least one blocking gate in the template matching range. In various cases, the step can be repeated for all templates and/or for all gates in the circuit, until a predetermined convergence criterion (e.g., any suitable predefined convergence criterion) is satisfied. The result can be that the circuit gate count is reduced (e.g., optimized).

As explained above, such conventional template matching is defined for quantum circuits in general. Thus, although conventional template matching is applicable to Clifford circuits, it does not utilize the specific properties of Clifford circuits for optimization. As explained herein, the inventors of various embodiments of the invention devised a technique for improving template matching (e.g., making template matching more efficient) that functions by exploiting the particular structure of Clifford circuits.

Next, consider peephole optimization. Similarly to template matching, peephole optimization is an iterative procedure that optimizes a circuit by considering subcircuits on a small subset of qubits, which small subset of qubits can be called A, and attempting to replace such subcircuits with an optimized version from a database/library of precomputed optimal circuits. At each step, for a given gate, all subcircuits on a fixed small number of qubits (e.g., |A|=4) including that gate are considered. For each subcircuit, its cost can be computed and the optimal cost of the unitary implemented by it can be computed (e.g., this optimal cost can be retrieved from the database of precomputed optimal circuits). If a substitution is beneficial, the subcircuit is replaced with the optimal implementation. The step can be repeated for all gates until any suitable predetermined convergence criterion is satisfied.

As explained above, such conventional peephole optimization works only if the subcircuit is completely decoupled from the rest of the circuit (e.g., the subcircuit cannot include any straddling two-qubit gates that couple the subcircuit to the rest of the circuit). As explained herein, the inventors of various embodiments of the invention devised a technique for enabling peephole optimization to be performed on a subcircuit even when the subcircuit is not fully decoupled from the rest of the circuit.

Various embodiments of the invention can address one or more of these technical problems. Specifically, various embodiments of the invention can provide systems and/or techniques that can facilitate partitioned template matching and/or symbolic peephole optimization, which can optimize Clifford circuits more efficiently than conventional template matching and/or conventional peephole optimization. In various aspects, the teachings described herein can amount to a heuristic approach to Clifford circuit optimization which can bridge the gap between non-scalable methods for the synthesis of exactly optimized Clifford circuits and the suboptimal (albeit asymptotically-optimal) inexpensive synthesis techniques. In various instances, embodiments of the invention can be considered as a computer-implemented tool (e.g., a computer-implemented software program) that can receive as input suboptimal Clifford circuits and that can produce as output optimized versions of those suboptimal Clifford circuits more efficiently and/or effectively than can conventional systems and/or techniques.

In various aspects, such a computer-implemented tool can apply partitioned template matching to an inputted Clifford circuit, which can be considered as an improved version of template matching that leverages/utilizes the unique properties/structures of Clifford circuits. Specifically, partitioned template matching leverages the observation that, in Clifford circuits, Pauli gates can always be "pushed" to the end of the circuit (e.g., via the Pauli-push equations explained above) without changing the non-Pauli Clifford gates (e.g., H, S, CNOT). In various aspects, partitioned template matching can include three steps. First, the Clifford circuit can be partitioned into a computation stage, a Pauli stage, and a SWAP stage by "pushing" any Pauli gates and any SWAP gates in the Clifford circuit to the end of the Clifford circuit (those having ordinary skill in the art will appreciate that SWAP gates can be "pushed" through Clifford circuits in the same and/or similar way as Pauli gates can be "pushed" through Clifford circuits). In various cases, the computation stage can include only H gates, S gates, and CNOT gates, the Pauli stage can include only Pauli gates, and the SWAP stage can include only SWAP gates. Second, template matching can be applied to the computation stage so as to reduce gate count (e.g., it can be easier to apply templates since the Paulis and SWAPs are pushed to the end of the circuit during the partitioning; in other words, the Paulis and the SWAPS are factored out of the computation stage). Third, the SWAP stage can be optimized by leveraging the fact that a SWAP gate can be implemented at the effective cost of one two-qubit gate if the SWAP gate can be "aligned" with another two-qubit gate. In some cases, if the application of templates or SWAP optimization yields any Pauli gates in the computation stage, such Pauli gates can be pushed through to the Pauli stage (e.g., the circuit can be re-partitioned). In some aspects, the application of a template to the computation stage can be prevented by a blocking gate. As explained herein, the inventors devised a novel floating-gates technique that can remove the blocking gate, thus allowing application of the template. In other words, the inventors devised a procedure that enables application of templates to sequences of non-consecutive gates that cannot be moved together directly. Such procedure attempts to move (e.g., "float") out single-qubit gates that block the application of a template by decomposing such single-qubit gates into linear combinations of Pauli operators and "pushing" the Pauli operators until they can be combined back into a single-qubit gate that is no longer blocking the application of the template.

In other words, while conventional template matching simply applies templates to a given Clifford circuit directly, partitioned template matching can include: (1) partitioning the given Clifford circuit into three stages (e.g., computation, Pauli, and SWAP) by "pushing" any Pauli gates and/or SWAP gates in the given Clifford circuit to an end of the given Clifford circuit; (2) applying templates to one of the three partitions (e.g., the computation stage); and (3) implementing SWAP optimization by aligning SWAPs with two-qubit gates. As also mentioned above, various embodiments of the invention can implement a floating-gates technique that can enable a template to be applied to non-consecutive sequences of gates. As explained herein, the floating-gates technique can involve rewriting a blocking gate as a linear combination of Paulis, and then "pushing" the Paulis out of a desired template matching range, thereby allowing application of the desired template. Conventional template matching simply includes neither such partitioning nor such a floating-gate technique.

In various instances, a computer-implemented tool in accordance with various embodiments of the invention can apply symbolic peephole optimization to a given circuit, which can be considered as an improved version of peephole optimization that can function even without complete sub-circuit decoupling. Specifically, when considering a subcircuit that is coupled/entangled to the rest of the circuit by a straddling gate, such straddling gate can be rewritten so that a target of the straddling gate is in the subcircuit (e.g., this can usually be done by the application of various Hadamard gates and/or Phase gates), and the rewritten straddling gate can then be replaced and/or represented by a symbolic Pauli gate as defined herein. As explained below, a symbolic Pauli gate is a Pauli gate that is controlled by a symbolic variable rather than by another qubit. It can be obtained from a two-qubit gate by removing the control and replacing the target with a Pauli gate as desired. Thus, a symbolic Pauli gate can be treated as a single-qubit gate. The subcircuit having the symbolic Pauli gate can then be optimized using dynamic programming and/or a library of precomputed optimal circuits. That is, when symbolic Pauli gates are implemented, the subcircuit can effectively be treated as if it is fully decoupled from the rest of the circuit notwithstanding the fact that the subcircuit is not fully decoupled from the rest of the circuit.

In other words, while conventional peephole optimization simply involves identifying a fully decoupled subcircuit and replacing all or part of the fully decoupled subcircuit with precomputed optimal circuits, symbolic peephole optimization can include: (1) identifying any suitable subcircuit, whether or not fully decoupled; (2) rewriting any straddling gates such that the targets of the straddling gates are in the subcircuit (e.g., such that the controls of the rewritten straddling gates are in the rest of the circuit); (3) replacing each rewritten straddling gate in the subcircuit with a symbolic Pauli gate (e.g., Pauli gate controlled by a symbolic variable); and (4) replacing all or part of the subcircuit having symbolic Pauli gates with precomputed optimal circuits. Conventional peephole optimization is simply unable to deal with straddling gates.

In various cases, partitioned template matching and symbolic peephole optimization can be sequentially combined for improved optimization of Clifford circuits (e.g., a computer-implemented tool as described herein can receive as input a Clifford circuit, can apply partitioned template matching to the inputted Clifford circuit, and can then apply symbolic peephole optimization, thereby yielding an optimized Clifford circuit as output).

Various embodiments of the invention can be employed to use hardware and/or software to solve problems that are highly technical in nature (e.g., to facilitate partitioned template matching and/or symbolic peephole optimization of Clifford circuits), that are not abstract and that cannot be performed as a set of mental acts by a human. Further, some of the processes performed can be performed by a specialized computer (e.g., performing, by a device operatively coupled to a processor, template matching on a Clifford circuit associated with a set of qubits; partitioning, by the device and prior to the template matching, the Clifford circuit into a computation stage, a Pauli stage, and a SWAP stage, wherein the template matching is performed on the computation stage; pushing, by the device, a blocking gate out of a template matching range in the computation stage by replacing the blocking gate with a linear combination of Pauli operators; selecting, by the device, a subset of qubits from the set of qubits; rewiring, by the device, at least one entangling gate in the computation stage such that a target of the at least one entangling gate is in the subset of qubits; replacing, by the device, the at least one rewired entangling gate with a symbolic Pauli gate, wherein the symbolic Pauli gate is a Pauli gate that is controlled by a symbolic variable; and performing, by the device, peephole optimization on the subset of qubits with the symbolic Pauli gate). Such defined tasks are not typically performed manually by humans. Moreover, neither the human mind nor a human with pen and paper can electronically optimize a Clifford circuit by electronically partitioning the Clifford circuit into three distinct stages, by electronically applying templating matching to one of those stages, and/or by electronically replacing straddling gates with symbolic Pauli gates. Instead, various embodiments of the invention are inherently and inextricably tied to computer technology and cannot be implemented outside of a quantum computing environment (e.g., various embodiments of the invention are directed to systems and/or computer-implemented methods that can more efficiently optimize inputted Clifford circuits; such systems and/or computer-implemented methods are of great utility in the field of quantum computation and cannot be practicably implemented in any sensible way outside of a computing environment).

In various instances, embodiments of the invention can integrate into a practical application the disclosed teachings regarding partitioned template matching and symbolic peephole optimization. Indeed, as described herein, various embodiments of the invention, which can take the form of systems and/or computer-implemented methods, can be considered as a computerized tool that can receive as input a Clifford circuit and that can generate as output an optimized version of the Clifford circuit (e.g., having a lower gate count). More specifically, such a computerized tool can facilitate such optimization by implementing partitioned template matching (as opposed to conventional template matching) and by implementing symbolic peephole optimization (as opposed to conventional peephole optimization). The electronic generation of optimized Clifford circuits is certainly a useful and practical application of computers, especially in view of how important Clifford circuits are to fault-tolerant quantum computation. Furthermore, as mentioned above, various embodiments of the invention can solve/address some technical problems experienced by conventional techniques. Specifically, conventional template matching is a generic procedure, but partitioned template matching can be considered as a Clifford-specific version of template matching that optimizes Clifford circuits more efficiently than conventional template matching allows. Additionally, conventional peephole optimization does not work if the subcircuit under consideration is not fully decoupled from the rest of the circuit (e.g., does not work if there is a straddling gate), but symbolic peephole optimization can be considered as an improved version of peephole optimization that works notwithstanding the absence of full decoupling. Overall, such systems and/or techniques clearly constitute a concrete and tangible technical improvement in the field of Clifford circuit optimization.

Furthermore, various embodiments of the invention can control real-world devices based on the disclosed teachings. For example, embodiments of the invention can receive as input a real-world suboptimal Clifford circuit, and can generate as output a real-world optimized version of the suboptimal Clifford circuit, by implementing partitioned template matching and symbolic peephole optimization. In some cases, embodiments of the invention can execute such a real-world optimized version of the suboptimal Clifford circuit on a real-world quantum computing device.

It should be appreciated that the figures and the herein disclosure are exemplary and non-limiting.

FIG. 1 illustrates a block diagram of an example, non-limiting system 100 that can facilitate partitioned template matching and/or symbolic peephole optimization in accordance with one or more embodiments described herein. As shown, a Clifford optimization system 102 can receive as input, via any suitable wired and/or wireless electronic connection, a suboptimal Clifford circuit 104 and can electronically generate as output an optimized Clifford circuit 106. In various aspects, the optimized Clifford circuit 106 can be functionally equivalent to the suboptimal Clifford circuit 104 (e.g., can implement the same overall transformation as the suboptimal Clifford circuit 104), but can have a lower gate count than the suboptimal Clifford circuit 104. In various aspects, the suboptimal Clifford circuit 104 can operate on any suitable number of qubits. If the suboptimal Clifford circuit 104 operates on n qubits for any suitable positive integer n, then the optimized Clifford circuit 106 can also operate on n qubits.

In various embodiments, the Clifford optimization system 102 can comprise a processor 108 (e.g., computer processing unit, microprocessor) and a computer-readable memory 110 that is operably connected to the processor 108. The memory 110 can store computer-executable instructions which, upon execution by the processor 108, can cause the processor 108 and/or other components of the Clifford optimization system 102 (e.g., partition component 112, template component 114, floating component 116, SWAP component 118, symbolic component 120, peephole component 122) to perform one or more acts. In various embodiments, the memory 110 can store computer-executable components (e.g., partition component 112, template component 114, floating component 116, SWAP component 118, symbolic component 120, peephole component 122), and the processor 108 can execute the computer-executable components.

In various embodiments, the Clifford optimization system 102 can comprise a partition component 112. In various aspects, the partition component 112 can partition (e.g., segment) the suboptimal Clifford circuit 104 into a computation stage, a Pauli stage, and a SWAP stage. In various cases, the partition component 112 can "push," via the Pauli-push equations mentioned above, any Pauli gates (e.g., X, Y, and/or Z) to an end of the suboptimal Clifford circuit 104. Similarly, the partition component 112 can "push," via analogous pushing equations that are applicable to SWAP gates, any SWAP gates in the suboptimal Clifford circuit 104 to an end of the suboptimal Clifford circuit 104. The result can be that all the SWAP gates are now located in one portion of the suboptimal Clifford circuit 104 referred to as the SWAP stage, all the Pauli gates are now located in a different portion of the suboptimal Clifford circuit 104 called the Pauli stage, and the remaining Clifford gates (e.g., H, S, CNOT) are located in a still different portion of the suboptimal Clifford circuit 104 called the computation stage. In other words, the partition component 112 can move different operators/gates of the suboptimal Clifford circuit 104 to different locations within the suboptimal Clifford circuit 104 without functionally changing the overall transformation implemented by the suboptimal Clifford circuit 104.

In various embodiments, the Clifford optimization system 102 can comprise a template component 114. In various aspects, the template component 114 can store, maintain, and/or otherwise have any suitable form of access to a library of templates. In various instances, a template can be any suitable string of quantum gates that implements and/or is equivalent to the identity transformation. In various cases, the template component 114 can facilitate template matching on the computation stage of the suboptimal Clifford circuit 104 by leveraging the library of templates. In other words, the template component 114 can apply one or more templates from the library of templates to the computation stage of the suboptimal Clifford circuit 104 in order to reduce the gate count of the suboptimal Clifford circuit 104. Note that, in some cases, application of templates to the computation stage can be easier and/or more efficient/effective than can application of templates to an unpartitioned version of the suboptimal Clifford circuit 104. That is, because all the Pauli gates and/or SWAP gates in the suboptimal Clifford circuit 104 are "pushed" toward an end of the suboptimal Clifford circuit 104 by the partition component 112, those Pauli gates and/or SWAP gates are no longer present in the computation stage and thus cannot block and/or otherwise impede the application of templates to the computation stage (e.g., without partitioning, the Pauli gates and/or SWAP gates could possibly be located in the middle of a template matching range, which could thus block/prevent the application of a template).

In various embodiments, the Clifford optimization system 102 can comprise a floating component 116. In various aspects, the floating component 116 can store, maintain, and/or otherwise have any suitable form of access to various floating-gate conversion rules. In various instances, as mentioned above, it can be possible for a gate in the computation stage to block and/or impede the application of a template (e.g., an unwanted H gate and/or an unwanted S gate can be in the template matching range). Conventionally, nothing is done, and a different template is tried. However, in various aspects, the floating component 116 can solve this problem. Specifically, in various instances, the floating component 116 can utilize the floating-gate conversion rules to rewrite and/or convert the blocking gate into a linear combination of Pauli gates (e.g., H can be expressed as a linear combination of Pauli gates, and S can be expressed as a linear combination of Pauli gates). Then, the floating component 116 can "push" the linear combination of Pauli gates, via the Pauli-push equations, out of the template matching range. Accordingly, the blocking gate is removed from the matching range and the template can be applied. In some cases, the floating component 116 can utilize the floating-gate conversion rules to covert the moved linear combination of Pauli operators back into a single-qubit gate. In other words, the partition component 112 can move Pauli gates out of template matching ranges, and the floating component 116 can move Hadamard and/or Phase gates out of template matching ranges.

In various embodiments, the Clifford optimization system 102 can comprise a SWAP component 118. In various aspects, the SWAP component 118 can store, maintain, and/or otherwise have any suitable form of access to various SWAP equivalence relations. In various aspects, a SWAP gate can be implemented at the effective cost of a two-qubit gate (e.g., CNOT) by pushing/merging the SWAP gate back into the computation stage and combining it with a two-qubit gate according to known equations/formulas. The SWAP equivalence relations can be those known equations/formulas. That is, the SWAP equivalence relations can be various equalities that indicate a resulting circuit and/or resulting gate string that is achieved when a SWAP gate is implemented serially with a CNOT gate and/or with a CZ gate. In this way, the SWAP component 118 can replace the SWAP gates that are in the SWAP stage of the suboptimal Clifford circuit 104.

In various embodiments, the Clifford optimization system 102 can comprise a symbolic component 120. In various aspects, the symbolic component 120 can perform various actions that can prepare the partitioned and template-matched version of the suboptimal Clifford circuit 104 for peephole optimization. Specifically, the symbolic component 120 can select any suitable subcircuit within the computation stage (e.g., a subcircuit that operates on two qubits and/or three qubits). In various instances, the symbolic component 120 can then rewrite any straddling gates such that their targets are in and/or operated on by the subcircuit. In various cases, a straddling gate can be a two-qubit gate (e.g., CNOT and/or CZ) that has exactly one of a target qubit or a control qubit in the subcircuit. If the target qubit of the straddling gate is in and/or operated on by the subcircuit, then the control qubit of the straddling gate is in and/or operated on by the rest of the circuit. On the other hand, if the control qubit of the straddling gate is in and/or operated on by the subcircuit, then the target qubit of the straddling gate is in and/or operated on by the rest of the circuit. Thus, a straddling gate couples the subcircuit to the rest of the circuit. In various aspects, the symbolic component 120 can utilize any suitable mathematical equations/formulas to rewire a straddling gate such that the target qubit of the straddling gate is in the subcircuit. In various instances, the symbolic component 120 can then replace the rewired straddling gate in the subcircuit with a symbolic Pauli gate. Like an entangling gate (e.g., CNOT and/or CZ), a symbolic Pauli gate can be a controlled Pauli gate (e.g., X, Y, and/or Z). However, unlike an entangling gate, a symbolic Pauli gate can be controlled by a symbolic variable rather than by another qubit. In various aspects, the value of the symbolic variable can be 0 or 1, and the symbolic variable can be an exponent of the symbolic Pauli gate. Thus, if the symbolic variable has a value of 1, the symbolic Pauli gate can implement the underlying Pauli. However, if the symbolic variable has a value of 0, the symbolic Pauli gate can instead implement the identity transformation. In this way, the symbolic Pauli gate can mimic the behavior of a controlled Pauli (e.g., CNOT and/or CZ), but can be treated as a single-qubit gate (e.g., can be treated as a non-entangling gate) for peephole optimization purposes.

In various embodiments, the Clifford optimization system 102 can comprise a peephole component 122. In various aspects, the peephole component 122 can store, maintain, and/or otherwise have any suitable form of access to a library of optimal circuits. In various aspects, the peephole component 122 can leverage the library of optimal circuits to perform peephole optimization on the subcircuit having symbolic Pauli gates (e.g., precomputed optimal circuits in the library can replace all and/or some of the gates in the subcircuit, thereby reducing gate count). As mentioned above, conventional peephole optimization techniques simply cannot be performed on a subcircuit that is not fully decoupled. However, due to symbolic Pauli gates, symbolic peephole optimization can be performed on a subcircuit that is not fully decoupled.

In various aspects, the Clifford optimization system 102 can iteratively execute all and/or some of the partition component 112, the template component 114, the floating component 116, the SWAP component 118, the symbolic component 120, and/or the peephole component 122, thereby generating as a result the optimized Clifford circuit 106.

Figure 2:
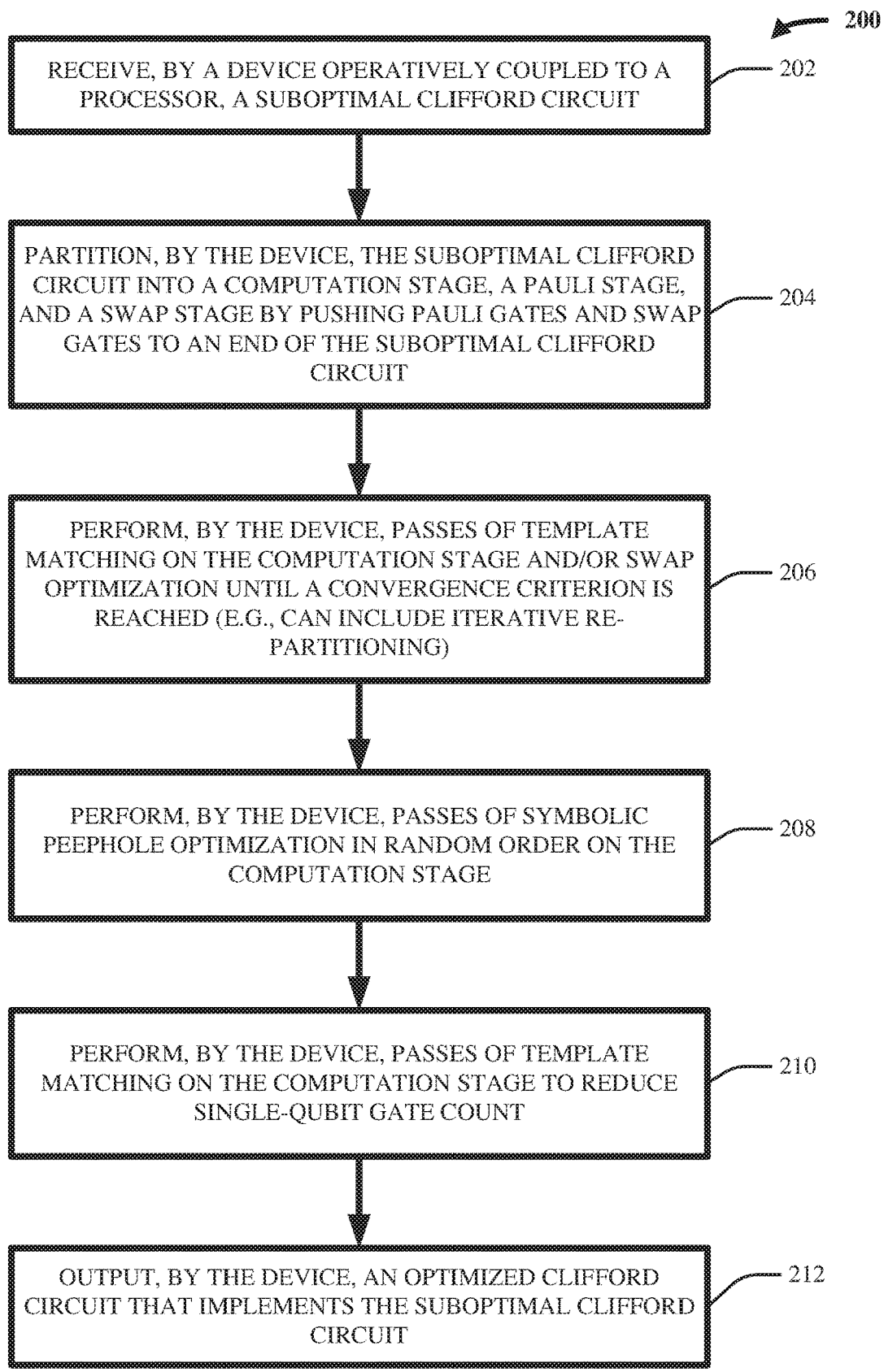
FIGS. 2-3 illustrate flow diagrams of example, non-limiting computer-implemented methods that facilitate partitioned template matching and/or symbolic peephole optimization in accordance with one or more embodiments described herein.
Figure 3:
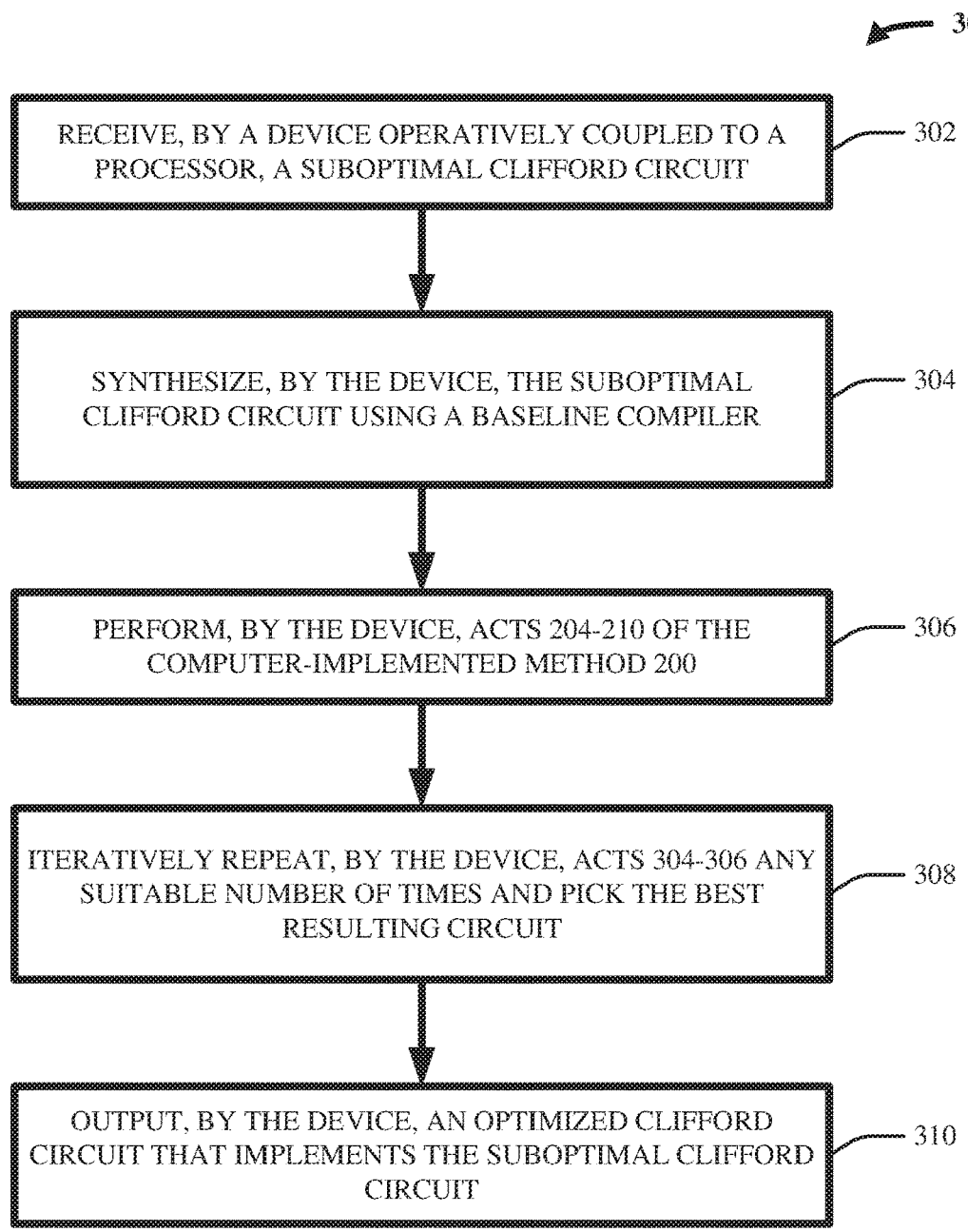

FIGS. 2-3 illustrate flow diagrams of example, non-limiting computer-implemented methods 200 and 300 that can facilitate partitioned template matching and/or symbolic peephole optimization in accordance with one or more embodiments described herein. In some cases, the computer-implemented methods 200 and 300 can be facilitated by the system 100.

First consider the computer-implemented method 200. In various embodiments, act 202 can include receiving, by a device operatively coupled to a processor, a suboptimal Clifford circuit (e.g., 104). Although a suboptimal Clifford circuit can be received and optimized directly in some embodiments, other embodiments can involve receiving a Clifford unitary, compiling the Clifford unitary via a technique based on Gaussian elimination over symplectic matrices (e.g., can be referred to as baseline compiling), and then optimizing the compiled circuit.

In various aspects, act 204 can include partitioning, by the device (e.g., 112), the suboptimal Clifford circuit into a computation stage, a Pauli stage, and a SWAP stage by "pushing" Pauli gates and/or SWAP gates to an end of the suboptimal Clifford circuit.

In various instances, act 206 can include performing, by the device, passes of template matching (e.g., via 114) on the computation stage and/or SWAP optimization (e.g., via 118) until a convergence criterion is reached. In some cases, this can include re-partitioning the suboptimal Clifford circuit whenever application of a template and/or merging of a SWAP gate generates a Pauli gate and/or a SWAP gate in the computation stage.

In various cases, act 208 can include performing, by the device (e.g., 120 and 122), passes of symbolic peephole optimization in random order on the computation stage.

In some aspects, act 210 can include again performing, by the device (e.g., 114), passes of template matching on the computation stage to further reduce single-qubit gate count.

In various instances, act 212 can include outputting, by the device, an optimized Clifford circuit (e.g., 106) that implements the suboptimal Clifford circuit.

Now, consider the computer-implemented method 300. In various embodiments, act 302 can include receiving, by a device operatively coupled to a processor, a suboptimal Clifford circuit (e.g., 104).

In various aspects, act 304 can include synthesizing, by the device, the suboptimal Clifford circuit using a baseline compiler (e.g., Gaussian elimination over symplectic matrices).

In various instances, act 306 can include performing, by the device, acts 204-210 of the computer-implemented method 200.

In various cases, act 308 can include iteratively repeating, by the device, acts 304-306 for any suitable number of times and picking, by the device, the best resulting circuit.

In various aspects, act 310 can include outputting, by the device, an optimized Clifford circuit (e.g., 106) that implements the suboptimal Clifford circuit.

As explained herein, various embodiments of the invention can facilitate partitioned template matching and symbolic peephole optimization, which can be considered as two novel algorithms for Clifford circuit optimization. In some cases, these novel algorithms can be applied in at least two ways. First, if the input is a Clifford unitary, optimization can begin by synthesizing a circuit using a baseline compiler (discussed with respect to FIG. 4), and then optimization can include reducing gate count by applying partitioned template matching and/or symbolic peephole optimization. Second, if the input is instead a Clifford circuit rather than a Clifford unitary, optimization can begin by either resynthesizing it or applying partitioned template matching and/or symbolic peephole optimization directly. In some cases, both of these ways can be performed in parallel, and the best result can be chosen. As mentioned above, in some cases, gate count can be further reduced by iteratively repeating baseline compiling and optimization for any suitable number of times and then picking the best result.

FIG. 4 illustrates an example, non-limiting table 402 and an example, non-limiting compiling algorithm/circuit 404 in accordance with one or more embodiments described herein. In other words, FIG. 4 shows how a baseline compiler can function.

Let PL(n) denote the group of Pauli operators on n qubits and CL(n) denote the group of Clifford operators on n qubits. A Clifford operator $D \in CL(n)$ is said to decouple a pair of Pauli operators $O, O' \in PL(n)$ if $D^{-1}OD = X_1$ and $D^{-1}O'D = Z_1$. Note that this is possible only if $OO' = -O'O$. Then, the following holds: any pair of anti-commuting Pauli operators $O, O' \in PL(n)$ can be decoupled by some Clifford operator D with CNOT cost $\leq (3/2)n + O(1)$, where the operator D can be computed in time O(n) (e.g., big-O notation). This can be referred to as Lemma 1.

Suppose the goal is to compile a given Clifford operator $C \in CL(n)$ using single-qubit gates and CNOT gates. For each qubit $j \in [n]$, let $O_j = CX_jC^{-1}$ and $O'_j = CZ_jC^{-1}$. Note that $O_j$ and $O'_j$ anticommute. Let $D_j \in CL(n)$ be a Clifford operator that decouples the pair $O_j$ and $O'_j$. Pick a qubit j such that $D_j$ has the minimum number of CNOT gates, or, if using a randomized version of the compiling algorithm, pick a random qubit. Define $$\tilde{C} = SWAP_{1,j} D_j^{-1} C$$

Then, $\tilde{C}$ commutes with $X_j$ and $Z_j$. This is possible only if $\tilde{C}$ acts trivially on the j-th qubit. Ignoring this trivial action, one can regard $\tilde{C}$ as an element of the smaller Clifford group CL(n−1). Proceeding inductively by reducing the number of qubits at each step, C can be decomposed into a product of SWAP gates and decoupling operators. Each decoupling operator can be compiled using single-qubit Cliffords and CNOT gates as described above.

A proof of Lemma 1 is as follows. Specifically, a decoupling operator D can be explicitly constructed as shown below so that D maps anticommuting Paulis O and O' to $X_1$ and $Z_1$ respectively. The goal can be to minimize the CNOT cost of D.

Suppose that Pauli operators O and O' are in the standard form if their action on any qubit j falls into one of the five cases shown in table 402 of FIG. 4. Recall that the single-qubit Clifford group CL(1) acts by permutations on the Pauli operators X, Y, Z. Thus, one can transform any Pauli pair O and O' into the standard form by applying a layer of single-qubit Clifford operators. This gives rise to a partition of n qubits into five disjoint subsets, [n]=ABCDE. Note that A has odd size since otherwise O and O' would commute. Let A(j) be the j-th qubit of A. Next, apply the algorithm/circuit 404 shown in FIG. 4. Let D be the operator realized by the compiling algorithm/circuit 404 combined with the initial layer of single-qubit Cliffords. A direct inspection shows that D has the desired decoupling property explained above up to sign factors. The latter can be fixed by applying Pauli $X_1$ or $Y_1$ or $Z_1$ as the last gate of D. The resulting circuit has a CNOT count at most $(3/2)|A|+|B|+|C|+|D|+O(1) \leq (3/2)n+O(1)$.

Note that the above proof uses the symbol D in two separate senses: as a way to denote the decoupling circuit (e.g., shown as algorithm/circuit 404), and also as a way to denote a subset of qubits (e.g., [n]=ABCDE). Those having ordinary skill in the art will appreciate these separate uses of the symbol D.

Figure 5:
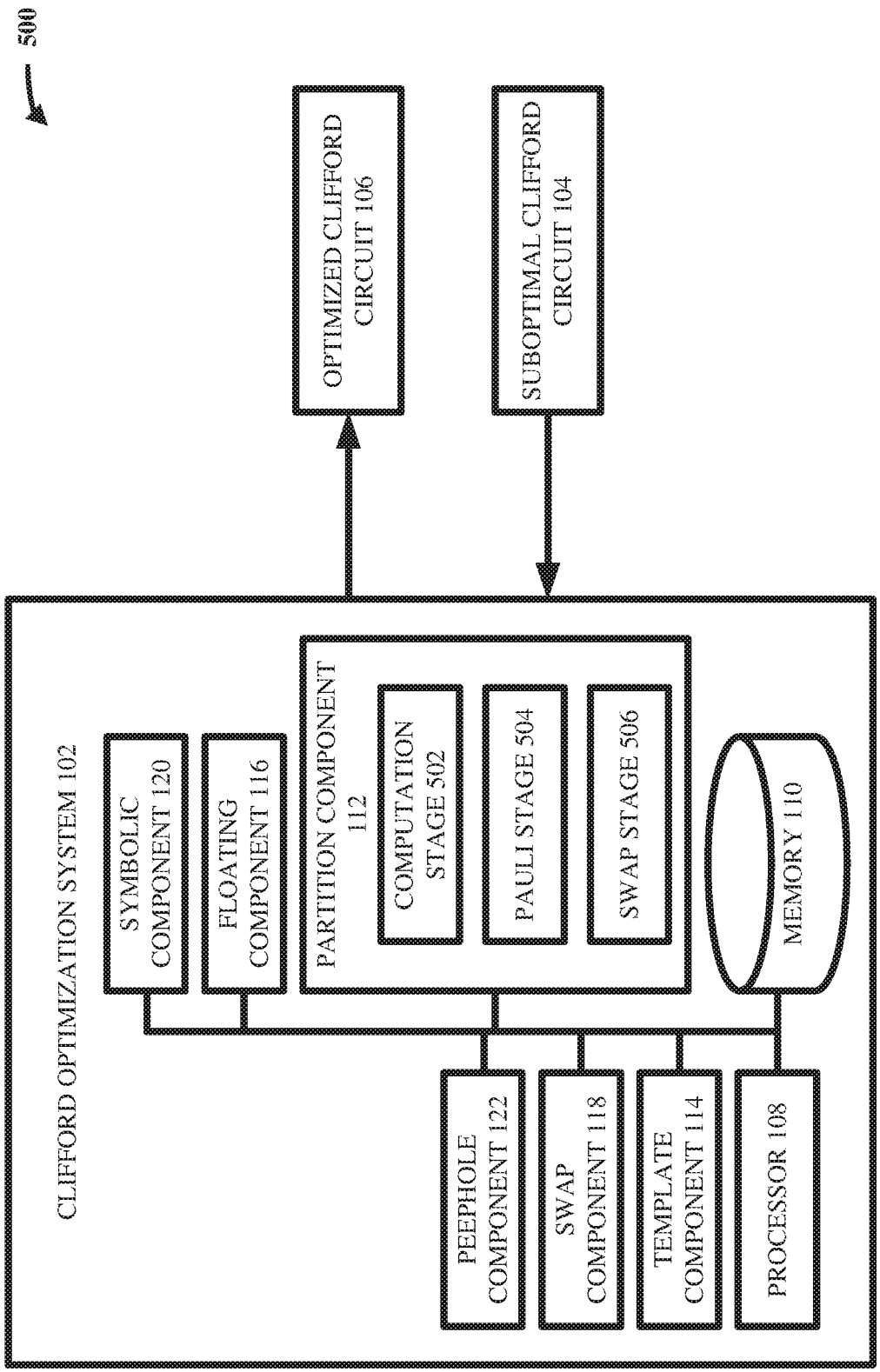
FIG. 5 illustrates a block diagram of an example, non-limiting system including a computation stage, a Pauli stage, and a SWAP stage that facilitates partitioned template matching and/or symbolic peephole optimization in accordance with one or more embodiments described herein.

FIG. 5 illustrates a block diagram of an example, non-limiting system 500 including a computation stage, a Pauli stage, and a SWAP stage that can facilitate partitioned template matching and/or symbolic peephole optimization in accordance with one or more embodiments described herein. As shown, the system 500 can, in some cases, comprise the same components as the system 100, and can further comprise a computation stage 502, a Pauli stage 504, and a SWAP stage 506.

Figure 7:
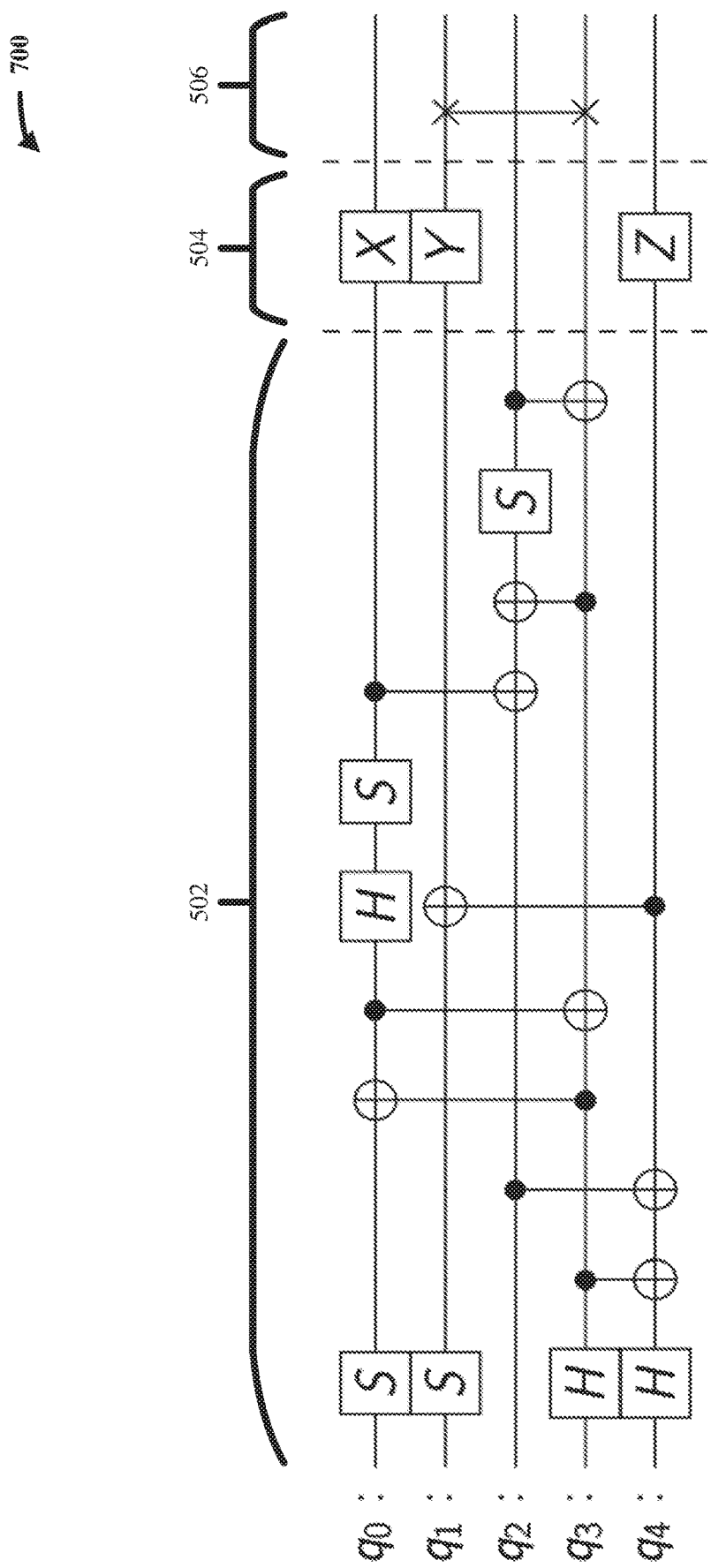
FIG. 7 illustrates an exemplary, non-limiting Clifford circuit that has been partitioned in accordance with one or more embodiments described herein.

In various embodiments, the partition component 112 can partition the suboptimal Clifford circuit 104 into the computation stage 502, the Pauli stage 504, and the SWAP stage 506. As explained above, Clifford gates can take tensor products of Pauli matrices into tensor products of Pauli matrices (e.g., via the Pauli-push equations). The partition component 112 can take advantage of this fact. Specifically, the partition component 112 can utilize the Pauli-push equations to "push" and/or move any Pauli operators in the suboptimal Clifford circuit 104 to a designated location in the circuit, referred to as the Pauli stage 504. In similar fashion, the partition component 112 can "push" and/or move SWAP gates in the suboptimal Clifford circuit 104 to a different designated location in the circuit, referred to as the SWAP stage 506 (e.g., those having ordinary skill in the art will appreciate that SWAPs can be "pushed" and/or moved through a circuit via equations that are analogous to the Pauli-push equations). The result can be that the Pauli stage 506 is a portion of the suboptimal Clifford circuit 104 that contains only Pauli gates (e.g., X, Y, Z), the SWAP stage 506 is a portion of the suboptimal Clifford circuit 104 that contains only SWAP gates, and the computation stage 502 is the remaining portion of the suboptimal Clifford circuit 104 that contains the remaining Clifford gates (e.g., H, S, CNOT). FIGS. 6-7 help to illustrate such partitioning.

FIG. 6 illustrates, in an exemplary, non-limiting way, how a Pauli gate can be "pushed" to an end of a Clifford circuit in accordance with one or more embodiments described herein. As shown, FIG. 6 depicts a two-qubit circuit 602 and an equivalent two-qubit circuit 604. As shown, the two-qubit circuit 602 includes two gates: a Clifford operator 608 (e.g., CNOT in the specific example shown), and a Pauli operator 606 (e.g., $X \otimes I$ and/or $X_0$ in the specific example shown) that is applied to the left of the Clifford operator 608. By using the Pauli-push equations, the two-qubit circuit 602 can be converted to the two-qubit circuit 604, which also includes two gates: the same Clifford operator 608, and a different Pauli operator 610 (e.g., $X \otimes X$ and/or $X_0 X_1$) that is applied to the right of the Clifford operator 608. This non-limiting example shows that a Pauli operator can be "pushed" from one side of a Clifford operator to another side via the Pauli-push equations.

Those having ordinary skill in the art will appreciate that SWAP gates can be similarly "pushed."

FIG. 7 illustrates an exemplary, non-limiting Clifford circuit 700 that has been partitioned in accordance with one or more embodiments described herein. In other words, FIG. 7 shows an exemplary, non-limiting result that can be obtained via partitioning by the partition component 112. The circuit 700 can be considered as an exemplary, non-limiting partitioned version of the suboptimal Clifford circuit 104. As shown, the Pauli-push equations (and analogous SWAP-push equations) can be leveraged to partition the suboptimal Clifford circuit 104 into three different stages. Specifically, all the Pauli operators in the suboptimal Clifford circuit 104 can be "pushed" and/or relocated by the partition component 112 to a particular location, referred to as the Pauli stage 504. Similarly, all the SWAP gates in the suboptimal Clifford circuit 104 can be "pushed" and/or relocated by the partition component 112 to a different particular location, referred to as the SWAP stage 506. In various aspects, the remainder of the suboptimal Clifford circuit 104 can be referred to as the computation stage 502. As shown, the computation stage 502 can, in some cases, include only H gates, S gates, and/or CNOT gates, the Pauli stage 504 can, in some cases, include only X gates, Y gates, and Z gates, and the SWAP stage 506 can, in some cases, include only SWAP gates.

Figure 8:
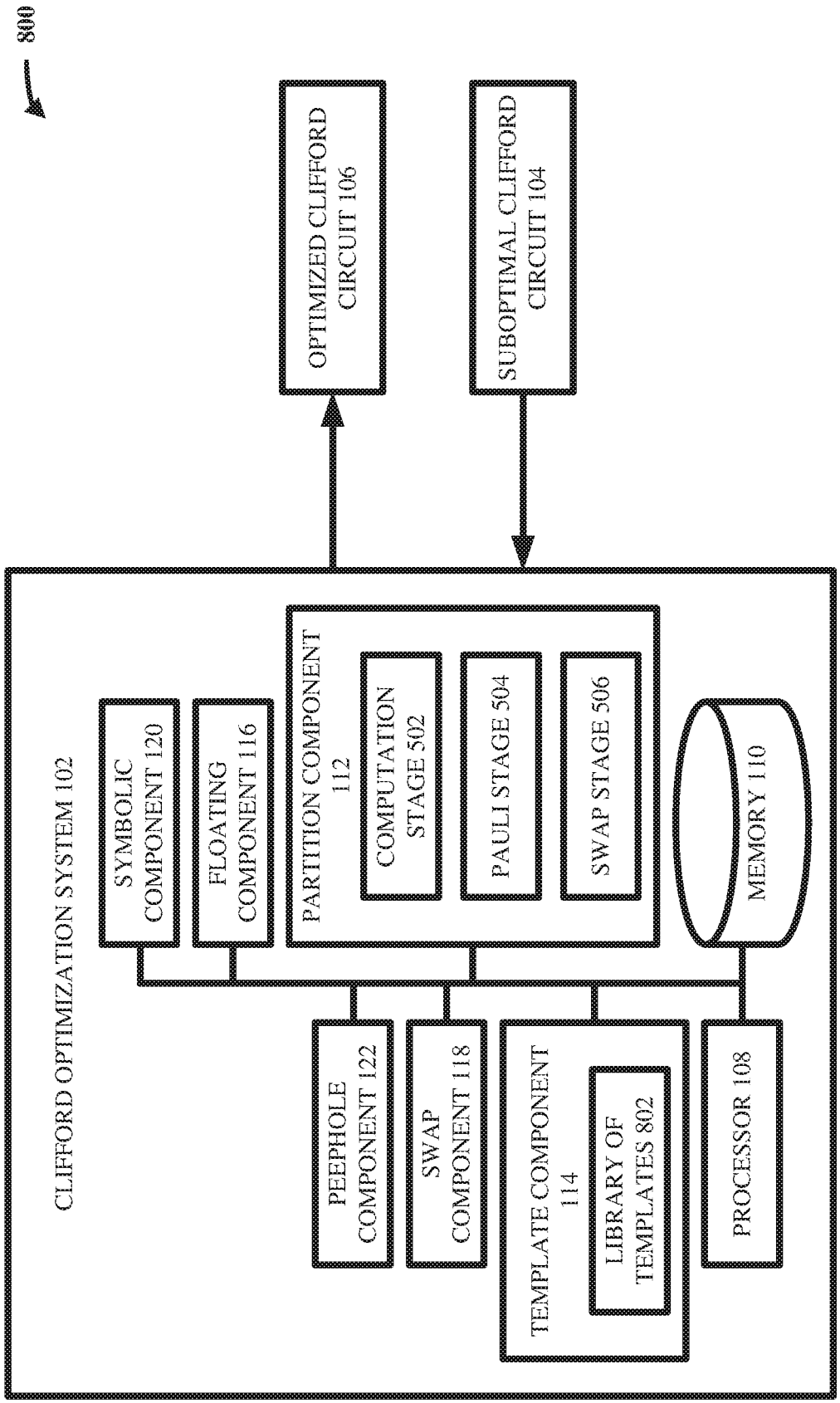
FIG. 8 illustrates a block diagram of an example, non-limiting system including a library of templates that facilitates partitioned template matching and/or symbolic peephole optimization in accordance with one or more embodiments described herein.

FIG. 8 illustrates a block diagram of an example, non-limiting system 800 including a library of templates that can facilitate partitioned template matching and/or symbolic peephole optimization in accordance with one or more embodiments described herein. As shown, the system 800 can, in some cases, comprise the same components as the system 500, and can further comprise a library of templates 802.

Figure 9:
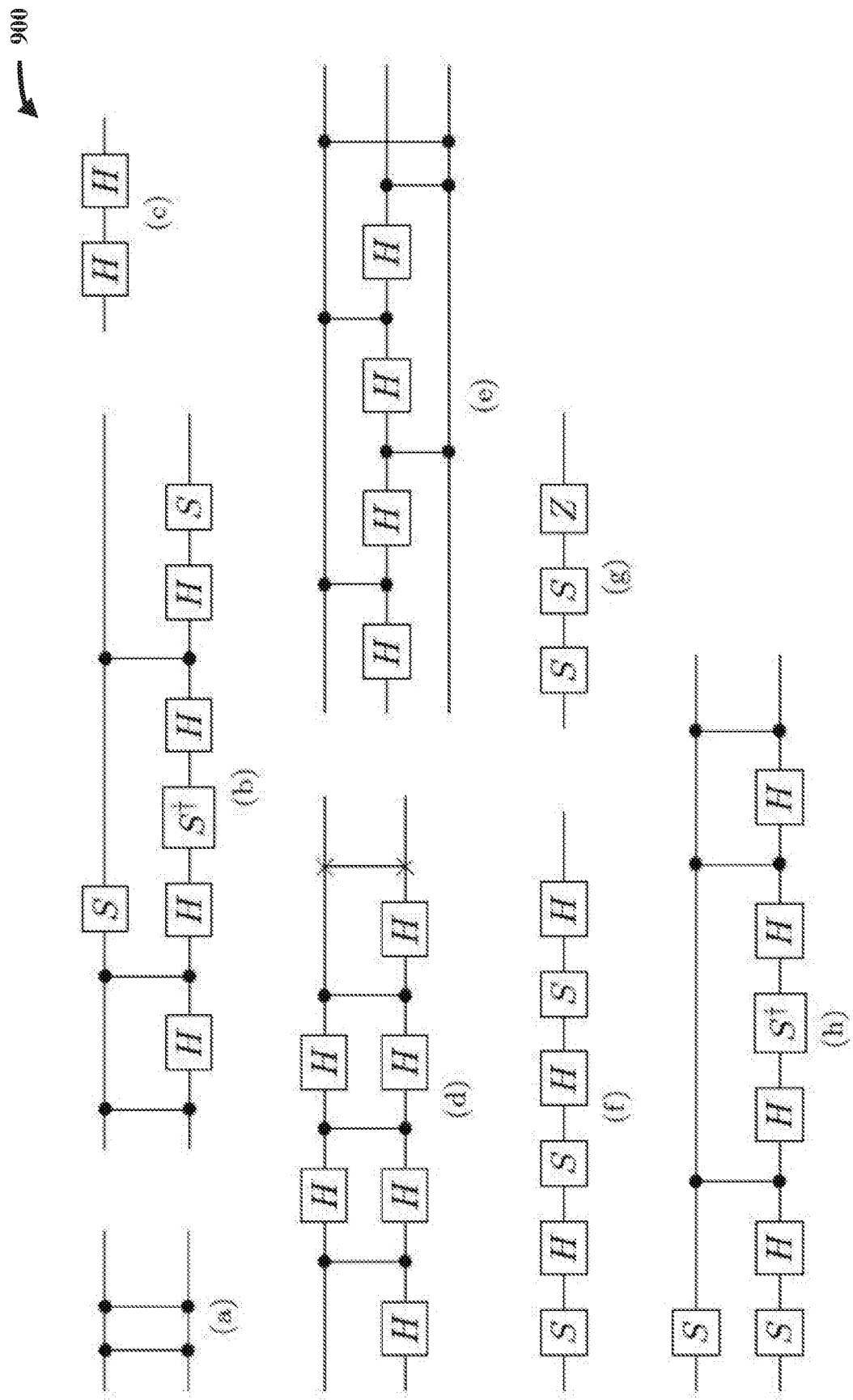
FIG. 9 illustrates exemplary, non-limiting templates that can be leveraged for template matching in accordance with one or more embodiments described herein.

In various embodiments, the template component 114 can electronically store, maintain, and/or otherwise have access to the library of templates 802. As explained above, a template can be any suitable string of gates that implements the identity transformation. In various aspects, the template component 114 can perform template matching on the computation stage 502 by leveraging the library of templates 802. As explained above, template matching can involve matching a subsequence of gates in a template to a corresponding subsequence of gates in the circuit. As long as the corresponding subsequence of gates in the circuit are consecutive (e.g., as long as there is no blocking gate in the template matching range), the subsequence of gates in the circuit can be replaced with the inverses of the remaining gates in the template, which can thus reduce the gate count of the circuit. FIG. 9 illustrates various exemplary and non-limiting templates that can be in the library of templates 802. In some cases, the template component 114 can simplify template matching by converting all two-qubit gates in the computation stage 502 to CZ gates (e.g., at the cost of introducing extra Hadamards) before performing the template matching.

Figure 10:
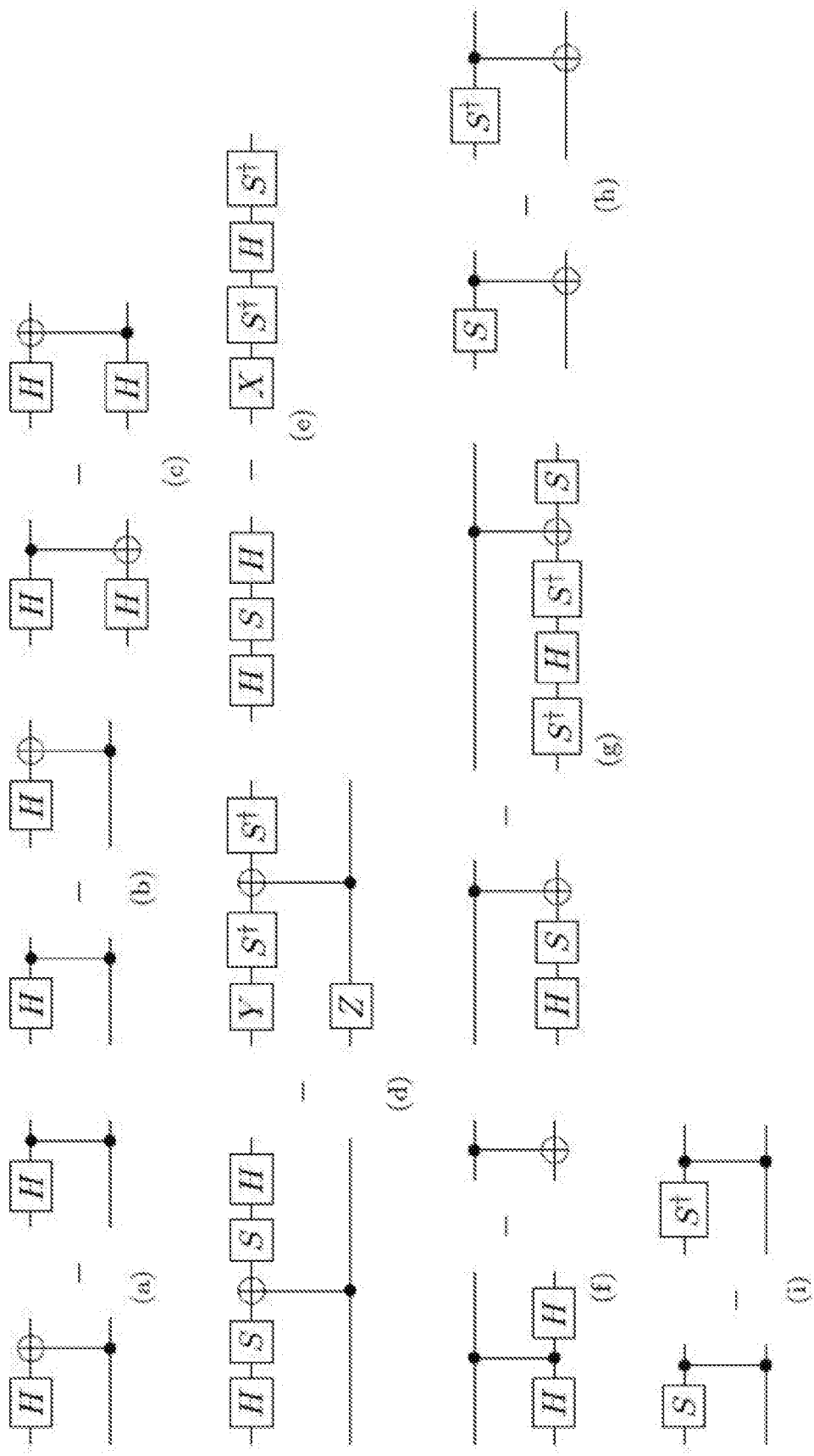
FIG. 10 illustrates exemplary, non-limiting templates that can be leveraged for Hadamard and/or Phase pushing during template matching in accordance with one or more embodiments described herein.

In various aspects, the template component 114 can implement Hadamard pushing and/or Phase pushing through two-qubit gates to further reduce single-qubit gate count and to increase the opportunities for template application. Suppose that the computation stage 502 has been optimized with templates. The idea can be to "push" Hadamard and Phase gates to one side of two-qubit gates as far as possible. "Pushing" a single-qubit gate through a two-qubit gate can be understood in terms of application of a template where a fixed subsequence must be matched. FIG. 10 illustrates exemplary and non-limiting templates that can be used for Hadamard and Phase "pushing." Consider template (a) in FIG. 10. Template (a) of FIG. 10 can be used to "push" an H gate to the right of a CNOT gate. Here, it can be required that the H and CNOT of the template (a) of FIG. 10 have to be matched (indicated by the dashed line) in the circuit and then replaced with the inverted remainder of the template (a) of FIG. 10. In the notation of the above discussion of template matching, the dash can be understood to restrict the application of the template (a) of FIG. 10 (e.g., which can be called a "Hadamard pushing template") to i=0 and p=2. Note that if the circuit is already optimized in terms of two-qubit gate count, template matching can be applied to single-qubit gate count reduction specifically by restricting the templates used to a subset that can reduce single-qubit gate count without also reducing the two-qubit gate count. Such a subset of templates can include single-qubit templates and templates with an even number of two-qubit gates when applied to replace half the entangling gates with the rest.

Figure 11:
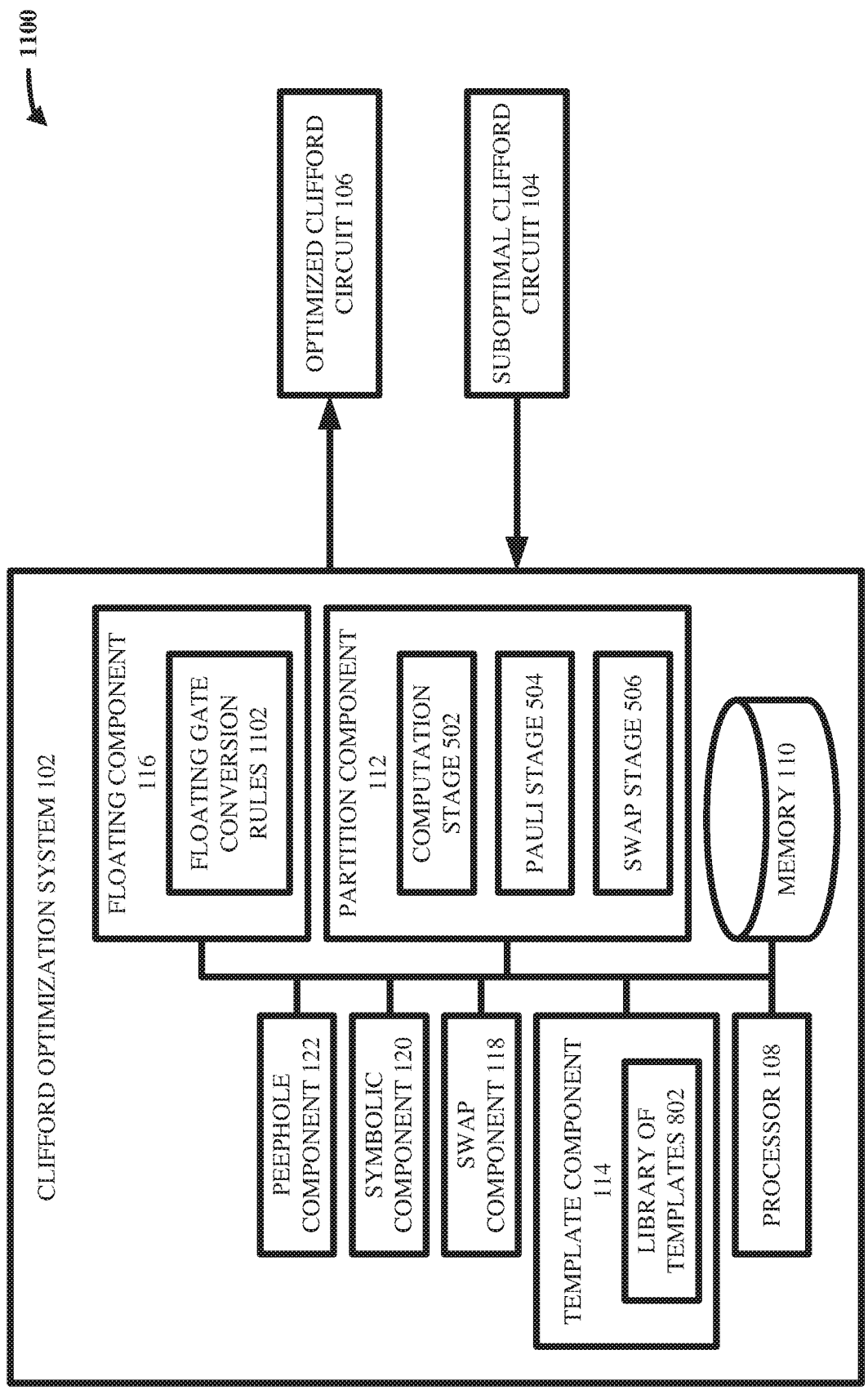
FIG. 11 illustrates a block diagram of an example, non-limiting system including floating gate conversion rules that facilitates partitioned template matching and/or symbolic peephole optimization in accordance with one or more embodiments described herein.

FIG. 11 illustrates a block diagram of an example, non-limiting system 1100 including floating gate conversion rules that can facilitate partitioned template matching and/or symbolic peephole optimization in accordance with one or more embodiments described herein. As shown, the system 1100 can, in some cases, comprise the same components as the system 800, and can further comprise floating gate conversion rules 1102.

As explained above, conventional template matching requires that the matched gates in the circuit can be made consecutive by commutation. If they are not consecutive, then a blocking gate can be said to be in the template matching range, which can prevent application of the template under consideration. In various aspects, the floating component 116 can address this problem. Specifically, if the template component 114 cannot directly apply a template from the library of templates 802 due to a blocking gate, the floating component 116 can take action. In various aspects, the floating component 116 can iteratively attempt to move out single-qubit gates that are in a template matching range (e.g., can attempt to remove blocking gates). In various aspects, this can involve moving blocking gates to the left of the leftmost matched gate in the circuit or to the right of the rightmost matched gate in the circuit, until either all blocking gates are moved out of the template matching range or until the matched gates can be moved together.

In various aspects, the floating component 116 can electronically store, maintain, and/or otherwise have access to the floating gate conversion rules 1102. In various aspects, the floating gate conversion rules 1102 can include rules (e.g., equivalence relations, equations, and/or formulas) for converting Phase gates and/or Hadamard gates into linear combinations of Pauli operators, and/or can include rules for converting linear combinations of Pauli operator back into single-qubit gates. Specifically, the floating gate conversion rules 1102 can include the following:

$$S = \frac{1+i}{2}I + \frac{1-i}{2}Z = \frac{1+i}{2}O_1 + \frac{1-i}{2}O_2$$

-continued $$H = \frac{1}{\sqrt{2}}X + \frac{1}{\sqrt{2}}Z = \frac{1}{\sqrt{2}}O_1 + \frac{1}{\sqrt{2}}O_2$$

The operators $O_1$ and $O_2$ can be independently moved according to the Pauli-push equations until they are moved outside of the template matching range and until both $O_1$ and $O_2$ are single-qubit Paulis acting on the same qubit (e.g., the actual values of $O_1$ and $O_2$ can change after each "push" and/or movement). At this point, the floating component 116 can convert $O_1$ and $O_2$ back to a single-qubit gate based on the rules specified in table 1202 and table 1204 of FIG. 12. More specifically, the table 1202 can specify the rules for converting a floating Phase gate into a one-qubit gate, based on the final values of $O_1$ and $O_2$ (e.g., an S gate can be converted into a linear combination of Paulis by the above equations, the linear combination of Paulis can be "pushed" via the Pauli-push equations such that the linear combination of Paulis is outside of the template matching range and is acting on one qubit, and then the pushed linear combination of Paulis can be replaced with the results shown in table 1202 depending on the values of the pushed linear combination of Paulis). Similarly, table 1204 can specify the rules for converting a floating Hadamard gate into a one-qubit gate, based on the final values of $O_1$ and $O_2$ (e.g., an H gate can be converted into a linear combination of Paulis by the above equations, the linear combination of Paulis can be "pushed" via the Pauli-push equations such that the linear combination of Paulis is outside of the template matching range and is acting on one qubit, and then the pushed linear combination of Paulis can be replaced with the results shown in table 1204 depending on the values of the pushed linear combination of Paulis). Note that Pauli terms cannot accrue complex phase by being pushed through a Clifford gate and that, in the case of Phase gates, the first term $O_1$ will always remain identity. From these observations and since the conversion is only defined up to global phase, the tables 1202 and 1204 can be considered as exhaustive. In various aspects, the floating gate conversion rules 1102 can include the tables 1202 and 1204, thus allowing the floating component 116 to convert floating Phase gates and floating Hadamard gates back into single-qubit gates.

Figure 13:
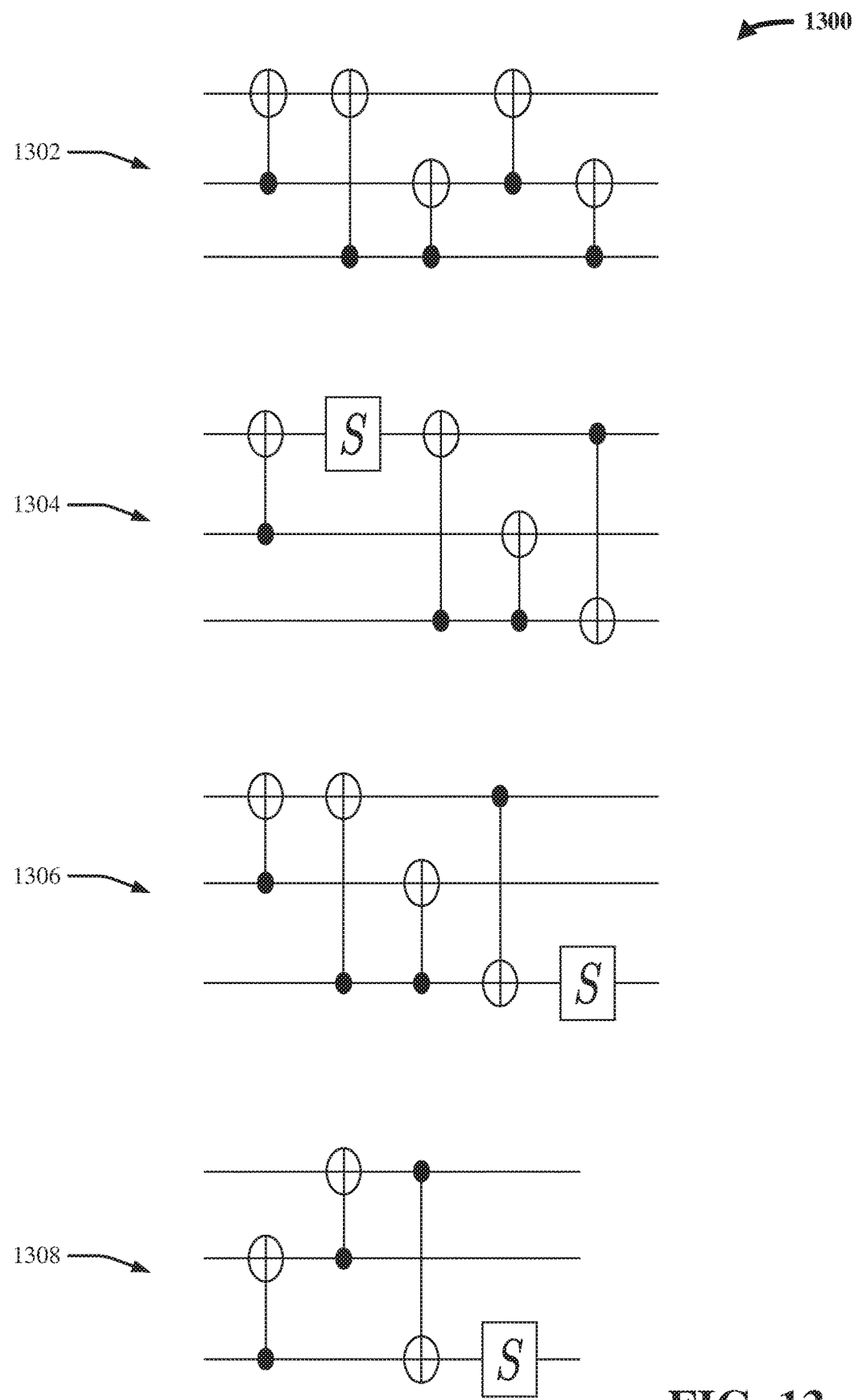
FIG. 13 illustrates, in an exemplary, non-limiting way, how floating gate pushing can be used to removing blocking gates from a template matching range in accordance with one or more embodiments described herein.

FIG. 13 illustrates, in an exemplary, non-limiting way, how floating gate pushing can be used to removing blocking gates from a template matching range in accordance with one or more embodiments described herein. In other words, FIG. 13 depicts an example of how the floating component 116 can function.

As shown, FIG. 13 depicts an exemplary, non-limiting template 1302 and an exemplary, non-limiting circuit 1304. Note that the template 1302 can be equivalent to the template (e) of FIG. 9. As can be seen, the first three gates (e.g., $CNOT_{2,1}$, $CNOT_{3,1}$, and $CNOT_{3,2}$, with ordering of qubits from top to bottom) of the template 1302 are matched in the circuit 1304 (e.g., the circuit 1304 also has $CNOT_{2,1}$, $CNOT_{3,1}$, and $CNOT_{3,2}$ in that order). Thus, the circuit 1304 can potentially be optimized by the template 1302. However, the template 1302 cannot be directly applied to the circuit 1304 due to the S gate that is in between the $CNOT_{2,1}$ and the $CNOT_{3,1}$ of the circuit 1304. In such case, the S gate can be considered as a blocking gate (e.g., the S gate is in between the matched gates in the circuit 1304, such that the matched gates in the circuit 1304 are not consecutive; equivalently, it can be said that the S gate is in the template matching range). Conventional template matching offers no solution for this problem; instead, a different template would be tried. However, the floating component 116 can solve this issue. Specifically, the floating component 116 can convert the S gate (e.g., a non-limiting example of a blocking gate) into a linear combination of Pauli operators according to the above equations (e.g., according to the floating gate conversion rules 1102). The floating component 116 can then independently push the linear combination of Pauli operators, via the Pauli-push equations, out of the template matching range (e.g., so that the S gate is no longer in between the $CNOT_{2,1}$, $CNOT_{3,1}$, and $CNOT_{3,2}$) and can continue such pushing until the linear combination of Pauli operators are single-qubit gates acting on the same qubit. At such point, the floating component 116 can use the floating gate conversion rules 1102 (e.g., the table 1202 since an S gate is being floated in this example) to convert the moved linear combination of Pauli operators back into a single-qubit gate. The circuit 1306 can be the result of floating the S gate of the circuit 1304 in this way. As shown in the circuit 1306, the $CNOT_{2,1}$, $CNOT_{3,1}$, and $CNOT_{3,2}$ are now consecutive, which allows application of the template 1302. Note that in this case, the floating S gate can have to be moved past the fourth gate (e.g., $CNOT_{1,3}$), since floating the S gate only past $CNOT_{3,1}$ and $CNOT_{3,2}$ in this example does not result in a one-qubit gate (e.g., again, those ordinary skill in the art will appreciate how to perform such floating via the Pauli-push equations). In various aspects, since the matched gates (e.g., $CNOT_{2,1}$, $CNOT_{3,1}$, and $CNOT_{3,2}$) are consecutive in the circuit 1306, the template 1302 can be applied to reduce the gate count. That is, the matched gates (e.g., $CNOT_{2,1}$, $CNOT_{3,1}$, and $CNOT_{3,2}$) in the circuit 1306 can be replaced with the inversion of the remaining gates in the template 1302. The result can be the optimized circuit 1308, which can have a lower gate count than the circuit 1304 as shown.

Figure 14:
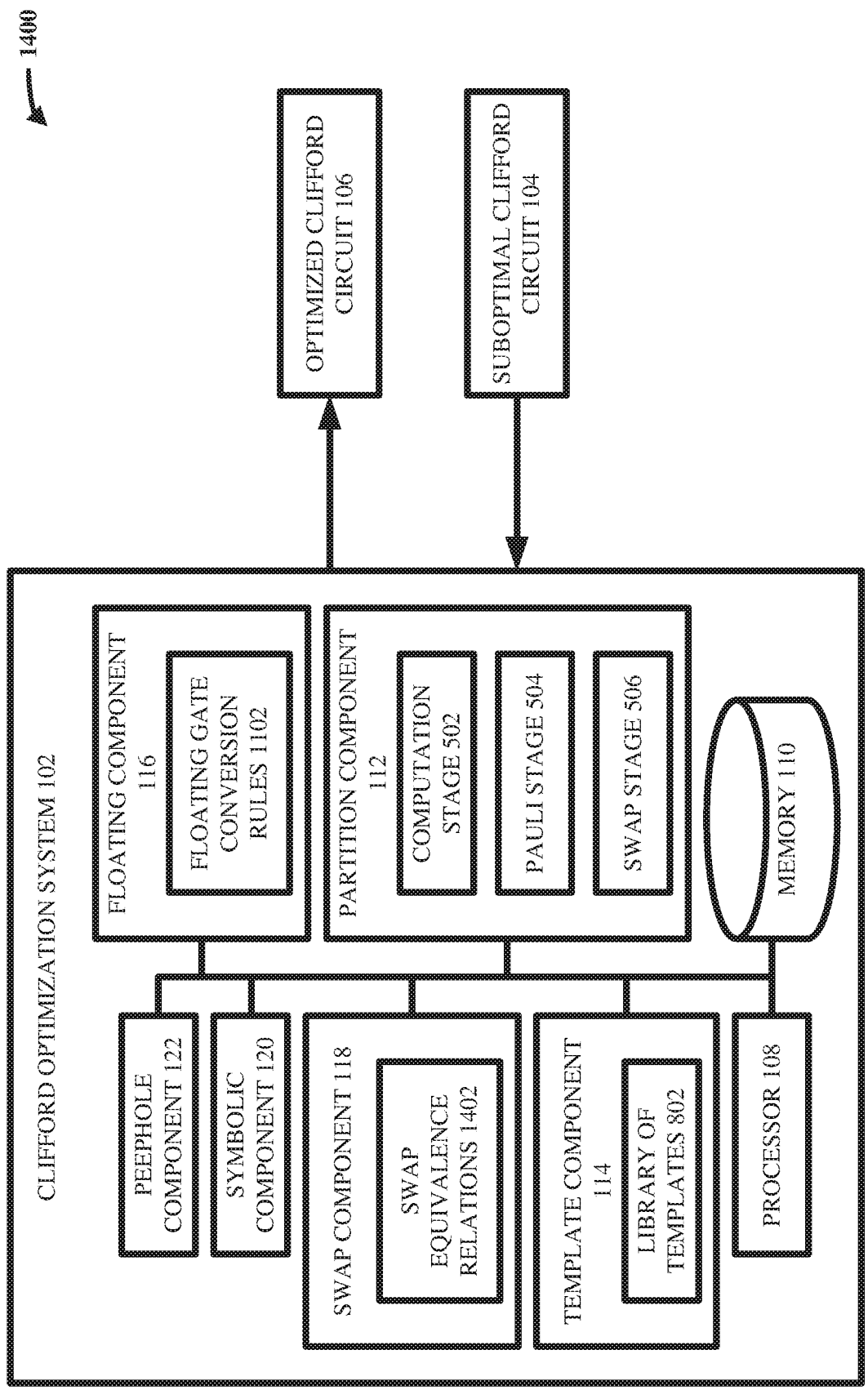
FIG. 14 illustrates a block diagram of an example, non-limiting system including SWAP equivalence relations that facilitates partitioned template matching and/or symbolic peephole optimization in accordance with one or more embodiments described herein.

FIG. 14 illustrates a block diagram of an example, non-limiting system 1400 including SWAP equivalence relations that can facilitate partitioned template matching and/or symbolic peephole optimization in accordance with one or more embodiments described herein. As shown, the system 1400 can, in some cases, comprise the same components as the system 1100, and can further comprise SWAP equivalence relations 1402.

In various embodiments, the SWAP component 118 can optimize the SWAP stage 506 (e.g., after the template component 114 and/or the floating component 116 facilitate template matching on the computation stage 502). In various aspects, the SWAP component 118 can electronically store, maintain, and/or otherwise have access to the SWAP equivalence relations 1402, and the SWAP equivalence relations 1402 can be used to facilitate SWAP optimization. Specifically, those having ordinary skill in the art will appreciate that a SWAP gate, which can be given by:

$$SWAP = \begin{bmatrix} 1 & 0 & 0 & 0 \\ 0 & 0 & 1 & 0 \\ 0 & 1 & 0 & 0 \\ 0 & 0 & 0 & 1 \end{bmatrix}$$

can be implemented at the effective cost of one extra two-qubit gate if the SWAP gate is aligned with and/or adjacent to a two-qubit gate. In other words, when a SWAP gate is serially implemented with some other two-qubit gate (e.g., CNOT and/or CZ), the resulting transformation can be equivalent to some other string of gates that excludes a SWAP gate but that includes a second two-qubit gate. In various aspects, the SWAP equivalence relations 1402 can include such equivalence relations, equations, and/or formulas. Thus, in various aspects, the SWAP component 118 can "push" and/or move a SWAP gate from the SWAP stage 506 into the computation stage 502 (e.g., can merge the SWAP gate back into the computation stage 502 via SWAP-push equations), so that the SWAP gate is aligned with a two-qubit gate in the computation stage 502. At this point, the SWAP component 118 can utilize the SWAP equivalence relations 1402 to replace both the moved SWAP gate and the two-qubit gate with which it is aligned with some other string of gates that includes two two-qubit gates. Non-limiting examples of such SWAP optimizations are depicted in FIG. 15.

Figure 15:
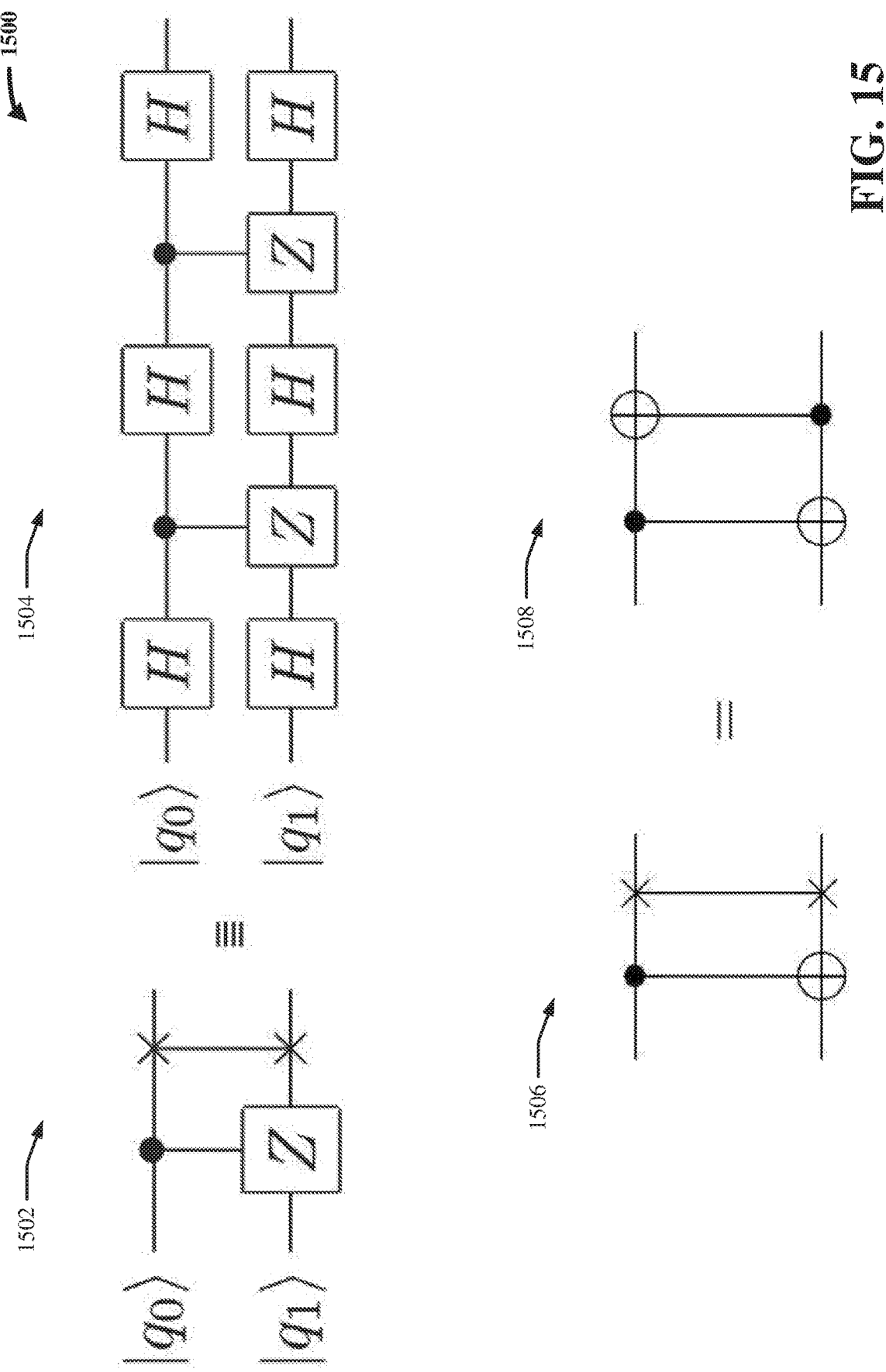
FIG. 15 illustrates, in an exemplary, non-limiting way, how a SWAP gate can be optimized at the cost of one entangling gate in accordance with one or more embodiments described herein.

FIG. 15 illustrates, in an exemplary, non-limiting way, how a SWAP gate can be optimized at the cost of one entangling gate in accordance with one or more embodiments described herein. As shown, FIG. 15 depicts an exemplary circuit 1502 and an equivalent exemplary circuit 1504. In various aspects, the circuit 1502 includes a CZ gate that is aligned with a SWAP gate (e.g., the CZ gate and the SWAP gate are adjacent and operate on the same qubits). In various aspects, application of equivalence relations pertaining to SWAP gates (e.g., application of the SWAP equivalence relations 1402) can convert the circuit 1502 into the circuit 1504. As shown, the circuit 1504 does not have the SWAP gate, but does have a second CZ gate (e.g., a second two-qubit gate). As another example, FIG. 15 depicts an exemplary circuit 1506 and an equivalent exemplary circuit 1508. In various aspects, the circuit 1506 includes a CNOT gate that is aligned with a SWAP gate (e.g., the CNOT gate and the SWAP gate are adjacent and operate on the same qubits). In various aspects, application of equivalence relations pertaining to SWAP gates (e.g., application of the SWAP equivalence relations 1402) can convert the circuit 1506 into the circuit 1508. As shown, the circuit 1508 does not have the SWAP gate, but does have a second CNOT gate (e.g., a second two-qubit gate). In this way, SWAP gates can be merged back into the computation stage 502 from the SWAP stage 506, and can be replaced at the cost of an additional two-qubit gate via the SWAP equivalence relations 1402.

Figure 16:
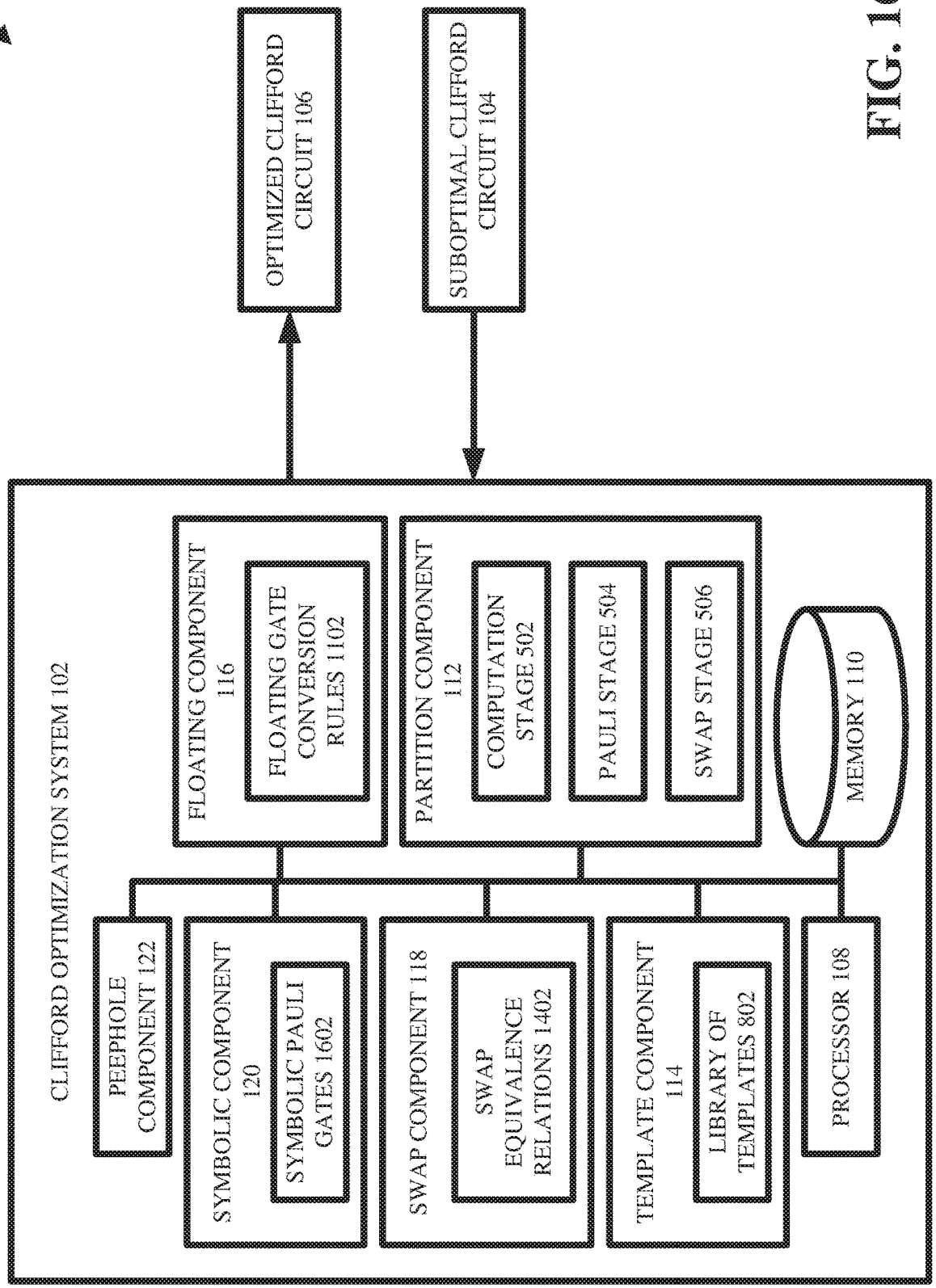
FIG. 16 illustrates a block diagram of an example, non-limiting system including symbolic Pauli gates that facilitates partitioned template matching and/or symbolic peephole optimization in accordance with one or more embodiments described herein.

FIG. 16 illustrates a block diagram of an example, non-limiting system 1600 including symbolic Pauli gates that can facilitate partitioned template matching and/or symbolic peephole optimization in accordance with one or more embodiments described herein. As shown, the system 1600 can, in some cases, comprise the same components as the system 1400, and can further comprise symbolic Pauli gates 1602.

As explained above, conventional peephole optimization techniques rely on databases of optimal few-qubit Clifford circuits that are used to optimize larger Clifford circuits. However, such conventional peephole optimization techniques are limited to few-qubit subcircuits that are completely decoupled from the remaining qubits. In various embodiments, the symbolic component 120 can solve this problem (e.g., can enable facilitation of peephole optimization even for few-qubit subcircuits that are not completely decoupled from the remaining qubits). The symbolic component 120 can do so by creating the symbolic Pauli gates 1602 in the suboptimal Clifford circuit 104 (e.g., in the computation stage 502 after performance of partitioned template matching).

Consider the Clifford circuits on n qubits expressed using the standard gate set:

$$C=\{I,X,Y,Z,H,S,CNOT\}$$

Note that if a circuit contains CZ gates, the CZ gates can be converted to CNOT gates by introducing Hadamard gates, as mentioned above. Let $C_n$ denote the set of all n-qubit circuits expressed using the gate set C. The cost of each gate can be defined as:

$$\$(CNOT)=1, \text{ and } \$(X)=\$(Y)=\$(Z)=\$(H)=\$(S)=0$$

The cost of a circuit can be defined as the combined cost of all gates that appear in the circuit. Symbolic peephole optimization can be considered as an algorithm that takes as input a circuit $U \in C_n$ and outputs an optimized circuit $U' \in C_n$ that implements the same Clifford operator as U (modulo the overall phase) and such that $\$(U') \leq \$(U)$. Note that symbolic peephole optimization can thus focus on reducing the two-qubit gate count (e.g., only the CNOT gates have a non-zero cost as defined above). This can nicely complement partitioned template matching, which can reduce single-qubit gate counts as described above.

Now, more details of symbolic peephole optimization will be discussed. Consider a circuit $U \in C_n$ and a small subset of qubits $A \subseteq [n]$ such that a database of optimized Clifford circuits on |A| qubits is available. The goal can be to meaningfully define and optimize the restriction of U onto A, with the focus on settings where A is not completely decoupled from the rest of the circuit.

Let $B=[n]\backslash A$ be the complement of A. A CNOT gate is said to be entangling and/or straddling if it couples A and B. Assume without loss of generality that each entangling/straddling CNOT has its target qubit in A. If this is not the case, the entangling/straddling CNOT gate can be rewired and/or rewritten such that its control qubit and target qubit switch places by adding extra Hadamard gates. An exemplary, non-limiting illustration of this is shown in FIG. 17.

As shown in FIG. 17, an exemplary circuit 1702 is equivalent to an exemplary circuit 1704. Note that the CNOT gate in the circuit 1702 has its control qubit in A and its target qubit in B. As shown, the control qubit and the target qubit can switch places when Hadamards are implemented in parallel both before and after the CNOT gate. This can result in the circuit 1704, which can have a CNOT gate whose control qubit is in B and whose target qubit is in A. Thus, the symbolic component 120 can rewrite/rewire any straddling gate via the addition of Hadamards, such that the target qubit of the straddling gate is in A (e.g., the desired subcircuit).

Once all straddling gates are rewired to have their targets in A, the symbolic component 120 can partition entangling/straddling CNOT gates into groups such that all CNOTs in the same group have the same control bit. Let k be the number of groups. Expanding each entangling/straddling CNOT as $|0\rangle\langle 0|\otimes I+|1\rangle\langle 1|\otimes X$ can yield:

$$U = \sum_{v\in\{0,1\}^k} U_A(v) \otimes U_B(v)$$

where $U_A$ (v) is a Clifford circuit obtained from U by retaining all gates acting on A and replacing each entangling/straddling CNOT gate from the i-th group with the Pauli gate $X^{v_i}$ acting on the target qubit. Likewise, $U_B(v)$ can be a (non-unitary) circuit obtained from U by retaining all gates acting on B and replacing each entangling/straddling CNOT from the i-th group with the projector $|v_i\rangle\langle v_i|$ acting on the control qubit. In various aspects, the single-qubit gates $X^{v_i}$, $Y^{v_i}$, and $Z^{v_i}$ can be referred to as symbolic Pauli gates (e.g., can be the symbolic Pauli gates 1602). Symbolic Pauli gates can be similar to controlled Pauli gates except that the control qubit is replaced by a symbolic variable $v_i \in \{0,1\}$.

In various aspects, the symbolic component 120 can optimize the family of Clifford circuits $U_A=\{U_A(v)\}_v$ as a regular Clifford circuit on |A| qubits with the following caveats. First, $U_A$ should be expressed using the Clifford-plus-symbolic-Pauli-gate gate set. The cost $\$(U_A)$ should be defined as the number of CNOTs in $U_A$ plus the number of symbolic Pauli gates in $U_A$. Second, the optimization should respect the temporal order of the symbolic Pauli gates that are in $U_A$. Namely, if i<j then all symbolic Pauli gates controlled by $v_i$ should be applied before any symbolic Pauli gates controlled by Third, the optimization should preserve the overall phase of each circuit $U_A(v)$ modulo phase factors $(-1)^{v_j}$ or $i^{v_j}$. The symbolic component 120 can generate phase factors by applying single-qubit gates Z or S to control qubits of the entangling/straddling CNOTs. These three conditions guarantee that the optimized circuit $U'_A$ can be lifted to a circuit $U' \in C_n$ which is functionally equivalent to U. Furthermore, $\$(U')=\$(U)-\$(U_A)+\$(U'_A)$.

In various aspects, the symbolic component 120 can select the subset A to be optimized. In some cases, performance of symbolic peephole optimization can be sensitive to the ordering of qubit subsets. From numerical experiments, the inventors of various embodiments of the invention found that the most successful strategy is random subset assignment. Concretely, the symbolic component 120 can generate a list of all $$\binom{n}{2}$$

(e.g., n choose 2, computed via the binomial coefficient function) pairs and $$\binom{n}{3}$$

(e.g., n choose 3) triplets of qubits. The symbolic component 120 can run passes until either the optimal cost is reached (e.g., for circuits for which the optimal cost is known) or until there is no improvement for two consecutive passes (e.g., the improvement falls below a predetermined threshold).

Figure 18:
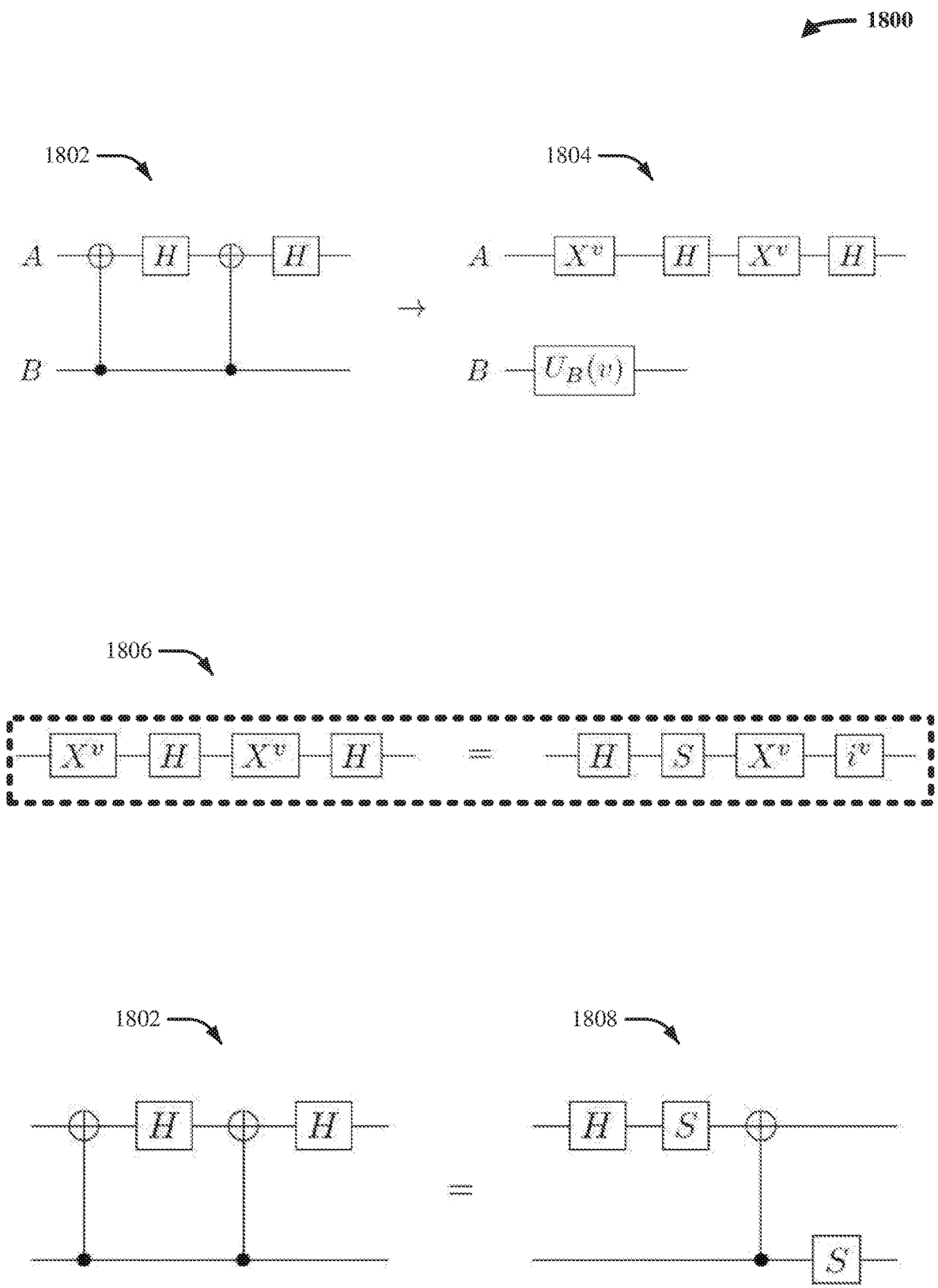
FIG. 18 illustrates, in an exemplary, non-limiting way, how symbolic Pauli gates can be used to improve peephole optimization in accordance with one or more embodiments described herein.

FIG. 18 illustrates a simple example of how symbolic peephole optimization can be facilitated. As shown, FIG. 18 depicts an exemplary circuit 1802 that operates on n=2 qubits. Let A be a subset containing only the first qubit, and thus B is the complement of A and contains only the second qubit. As shown, the circuit 1802 can have two straddling CNOT gates that couple A and B. As also shown, those two straddling CNOT gates can have their target qubits in A. As explained above, if this were not the case, the symbolic component 120 can rewire/rewrite the straddling CNOT gates via the application of Hadamard gates, such that the targets are in A. In various aspects, the symbolic component 120 can replace each straddling CNOT gate with a symbolic Pauli gate, thereby yielding the circuit 1804. As shown, the circuit 1804 no longer has the straddling CNOT gates. Instead, the subcircuit A of the circuit 1804 has a symbolic Pauli-X gate (e.g., $X^v$) where each straddling CNOT gate was previously located. Moreover, the remainder B of the circuit 1804 can have a non-unitary gate $U_B(v)$ (e.g., as explained above, this can comprise various projectors based on the symbolic variable v). As shown, the subcircuit $U_A = \{X^v H X^v H\}_v$ has one control bit (e.g., k=1) and contains two symbolic Pauli gates. Thus, $\$(U_A)=2$. Using the identity 1806 (e.g., the identity 1806 can be retrieved from any suitable library/database of precomputed optimal circuits), the symbolic component 120 can convert the subcircuit $U_A = \{X^v H X^v H\}_v$ to the subcircuit $U'_A = \{HSX^v i^v\}_v$ which is functionally equivalent to $U_A$ such that $\$(U'_A)=1$. The phase factor $i^v$ can be implemented by the symbolic component 120 via a single-qubit S gate acting on B. The symbolic component 120 can then lift $U'_A$ (e.g., replace any symbolic Pauli gates with straddling CNOTs), thereby yielding the optimized circuit 1808.

Figure 19:
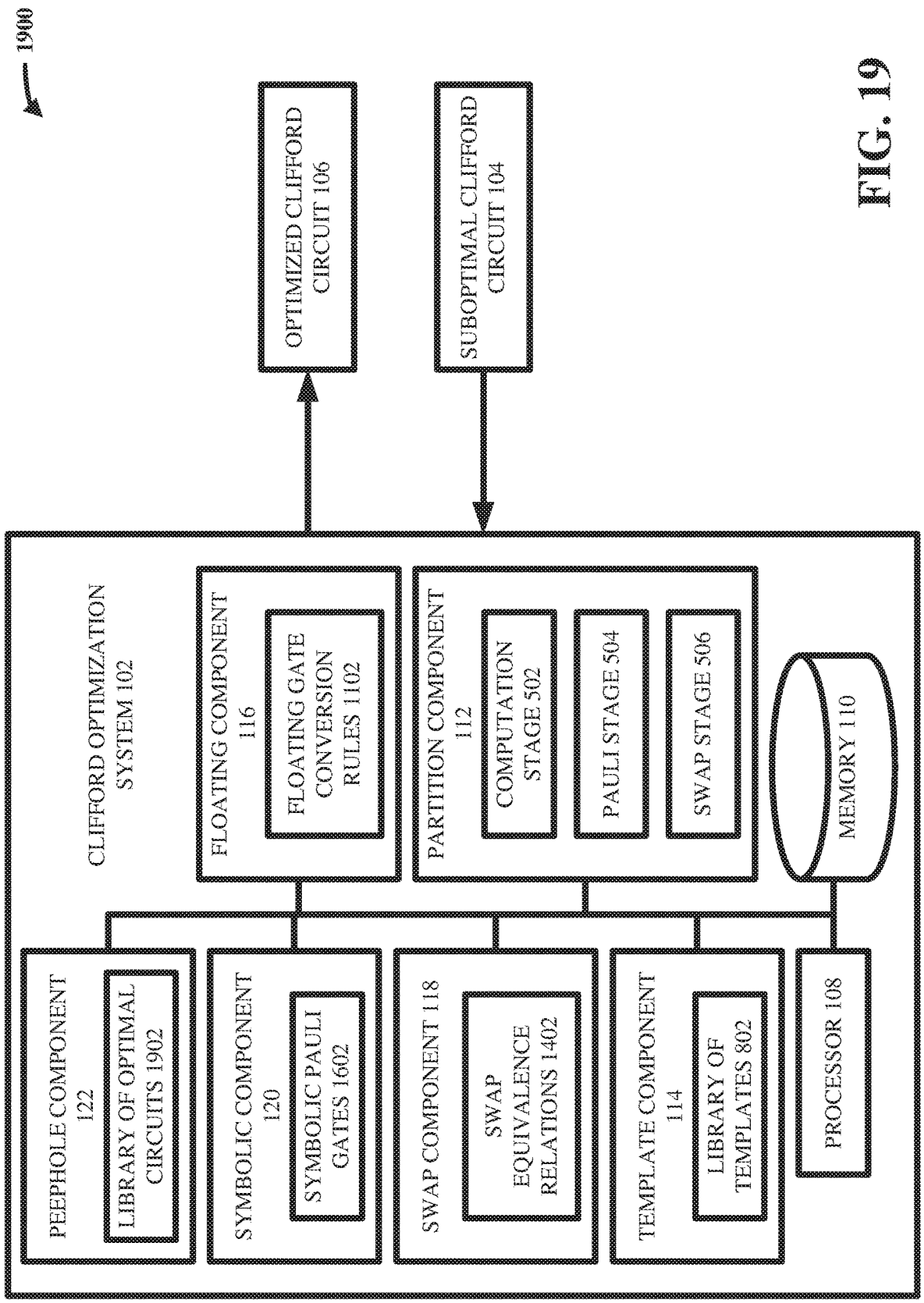
FIG. 19 illustrates a block diagram of an example, non-limiting system including a library of optimal subcircuits that facilitates partitioned template matching and/or symbolic peephole optimization in accordance with one or more embodiments described herein.

FIG. 19 illustrates a block diagram of an example, non-limiting system 1900 including a library of optimal subcircuits that can facilitate partitioned template matching and/or symbolic peephole optimization in accordance with one or more embodiments described herein. As shown, the system 1900 can, in some cases, comprise the same components as the system 1600, and can further comprise a library of optimal circuits 1902.

As explained above, the symbolic component 120 can prepare the suboptimal Clifford circuit 104 for peephole optimization by rewiring straddling gates and/or implementing the symbolic Pauli gates 1602. Then, in various aspects, the peephole component 122 can perform peephole optimization on the subcircuit containing the symbolic Pauli gates 1602 by leveraging the library of optimal circuits 1902 (e.g., the peephole component 122 can electronically store, maintain, and/or otherwise have any suitable form of access to the library of optimal circuits 1902).

In various aspects, the peephole component 122 and/or the symbolic component 120 can implement dynamic programming to optimize subcircuits that include the symbolic Pauli gates 1602. In various aspects, such dynamic programming can guarantee finding maximal optimization for a given fixed set of qubits (e.g., for a subcircuit). Such dynamic programming will now be described in detail.

Let PL(n) denote the group of Pauli operators on n qubits and CL(n) denote the group of Clifford operators on n qubits. Consider a quantum circuit composed of Clifford gates C and symbolic Pauli gates $P_v$, where $v \in \{0,1\}$ is a formal variable and $P \in PL(n)$. A Clifford-plus-symbolic-Pauli-gate operator on n qubits that contains k symbolic Pauli gates can be compactly specified by a k-tuple of n-qubit Pauli operators $P_1, \ldots, P_k \in PL(n)$ and a Clifford operator $R \in CL(n)$ such that:

$$U(v) = P_k^{v_k} \ldots P_2^{v_2} P_1^{v_1} R, \text{ where } v \in \{0,1\}^k.$$

A Clifford-plus-symbolic-Pauli-gate circuit that implements $U(v)$ has a form:

$$C_k Q_k^{v_k} \ldots C_2 Q_2^{v_2} C_1 Q_1^{v_1} C_0$$

for some Clifford circuits $C_0, \ldots, C_k \in CL(n)$ and some Pauli operators $Q_1, \ldots, Q_k \in PL(n)$ that satisfy $$C_k \ldots C_2 C_1 C_0 = R =$$

$$(C_k \ldots C_j) Q_j (C_k \ldots C_j)^{-1} = P_j, \text{ where } j=1, \ldots, k.$$

The cost of the Clifford-plus-symbolic-Pauli-gate circuit above is defined as:

$$\$(C) = \sum_{j=0}^{k} \$(C_j) + \sum_{j=1}^{k} |Q_j|$$

It can be desired to minimize the function $\$(C)$ over all tuples of Clifford operators $C_0, \ldots, C_k$ satisfying the above conditions. To perform this minimization efficiently, perform a change of variables:

$$B_j = C_k \ldots C_j, \text{ where } 1 \leq j \leq k.$$

Then, $Q_j = B_j^{-1} P_j B_j$ for $1 \leq j \leq k$. Furthermore, $C_0 = B_1^{-1} R$, $C_j = B_{j+1}^{-1} B_j$ for $1 \leq j \leq k$, and $C_k = B_k$. The below convention can be used:

$$B_0 = R \text{ and } B_{k+1} = I$$

Then $C_j = B_{j+1}^{-B}{}_j$ for all $1 \leq j \leq k$. The following then is achieved:

$$\$(C) = \Sigma_{j=0}^{k} \$(B_{j+1}^{-1} B_j) + \Sigma_{j=1}^{k} |B_j^{-1} P_j B_j| = F(B_1, \ldots, B_k).$$

Let $LOC(n) \subseteq CL(n)$ be the product subgroup of the Clifford group generated by single-qubit Clifford gates. One can easily check that the function F is invariant under multiplications $B_j \leftarrow B_j L_j$, where $L_j \in LOC(n)$. Thus, F depends only on left coset $B_j * LOC(n)$. Fix a canonical representative of each left coset and let $$REP(n) \subset CL(n)$$

be the set of canonical representatives. By definition, the full Clifford group is a disjoint union $$CL(n) = \bigcup_{B \in REP(n)} B * LOC(n)$$

The canonical representative of a coset can be the lexicographically smallest element of the coset. The following lemma gives an efficient algorithm for computing canonical representatives for a given Clifford operator: for a given Clifford operator $C \in CL(n)$, one can compute the representative $rep(C) = B \in REP(n)$ such that $C*LOC(n) = B*LOC(n)$ in time $O(n^3)$. This can be referred to as Lemma 2.

Now, the function F can be minimized over $B_1, \ldots, B_k \in REP(n)$ using the dynamic programming method and a precomputed lookup table for the cost function $\$(B)$ with $B \in REP(n)$. Namely, define intermediate objective functions $f_1, \ldots, f_k : REP(n) \to Z_+$, where $Z_+$ denotes positive integers, such that $$f_1(B_1) = \$(rep(B_1^{-1} R)) + |B_1^{-1} P_1 B_1|, \text{ and}$$

$$f_j(B_j) = \min_{B_{j-1} \in REP(n)} f_{j-1}(B_{j-1}) + \$(rep(B_j^{-1} B_{j-1})) + |B_j^{-1} P_j B_j|,$$

for $2 \leq j \leq k$.

Finally, the following is obtained:

$$\min_{B_1, \ldots, B_k \in REP(n)} F(B_1, \ldots, B_k) = \min_{B_k \in REP(n)} f_k(B_k) + \$(B_k)$$

Lookup tables for the functions $f_1, \ldots, f_k$ can be computed one by one. Constructing each lookup table requires an iteration over REP(n). This is doable for n=2,3. Note that due to the reliance on dynamic programming algorithm to ensure that all optimization that can happen does happen, symbolic peephole optimization can be more resource-demanding as compared to conventional peephole optimization. Namely, for each subcircuit considered, symbolic peephole optimization can perform |REP(n)|² lookups, compared to one in conventional peephole optimization. The size of the lookup table can be |REP(n)|=6720 for n=3. However, symbolic peephole optimization offers the benefit that the examined subcircuits need not be fully decoupled.

Now, consider the following proof of Lemma 2. The above algorithm for computing the lexicographically smallest element of a coset can work for a particular choice of order, as explained below. A symplectic matric C of size 2n can be parameterized by $4n^2$ bits which form an integer int(C). Below are shown the order of bits in int(C) for n=2, 3, 4:

$$\begin{bmatrix} 0 & 1 \\ 2 & 3 \end{bmatrix}, \begin{bmatrix} 0 & 1 & 2 & 3 \\ 4 & 5 & 6 & 7 \\ 8 & 9 & 10 & 11 \\ 12 & 13 & 14 & 15 \end{bmatrix}, \begin{bmatrix} 0 & \ldots & 15 \\ \ldots & \ldots & \ldots \\ 48 & \ldots & 63 \end{bmatrix}$$

This, along with the natural order of integer numbers, defines an ordering of Clifford operators that is used in various embodiments of the invention. The goal can be to minimize int($C^*V_1V_2 \ldots V_n$) over single-qubit Clifford gates $V_1, \ldots, V_n$, where the single-qubit gate $V_q$ acts on qubit q. For each qubit q, one can keep track of the subset of single-qubit Clifford operators $G_q$ from which $V_q$ is chosen, such that:

$G_q=\{H,S,HSH\}$ or $G_q=\{HSH\}$ or $G_q=\emptyset$

Each step of the algorithm examines a pair of entries $(C_{i,q}, C_{i,q+n})$ parameterizing a single-qubit Pauli operator according to:

$I=(0,0), X=(1,0), Z=(0,1), Y=(1,1)$

The chosen order of Clifford operators corresponds to the order of single-qubit Pauli operators:

$I < X < Z < Y$

For each row of the symplectic matrix C and for each qubit, the algorithm attempts to map Y or Z to X by applying S or H respectively. If this is possible (e.g., the application of a gate would perform the desired conversion and the corresponding gate is contained in $G_q$), the set of $G_q$ is set to $G_q \leftarrow \{HSH\}$. If this is not possible, the algorithm attempts to map Y to Z by applying HSH. If this is possible, the set is updated to $G_q \leftarrow \emptyset$. One can easily check that the algorithm indeed returns the smallest element of the coset $C^*LOC(n)$. Each multiplication $C \leftarrow CS_q$, $C \leftarrow CH_q$, and $C \leftarrow CH_qS_qH_q$ takes time O(n). Since the number of such multiplications is $O(n^2)$, the overall runtime is $O(n^3)$.

Figure 20:
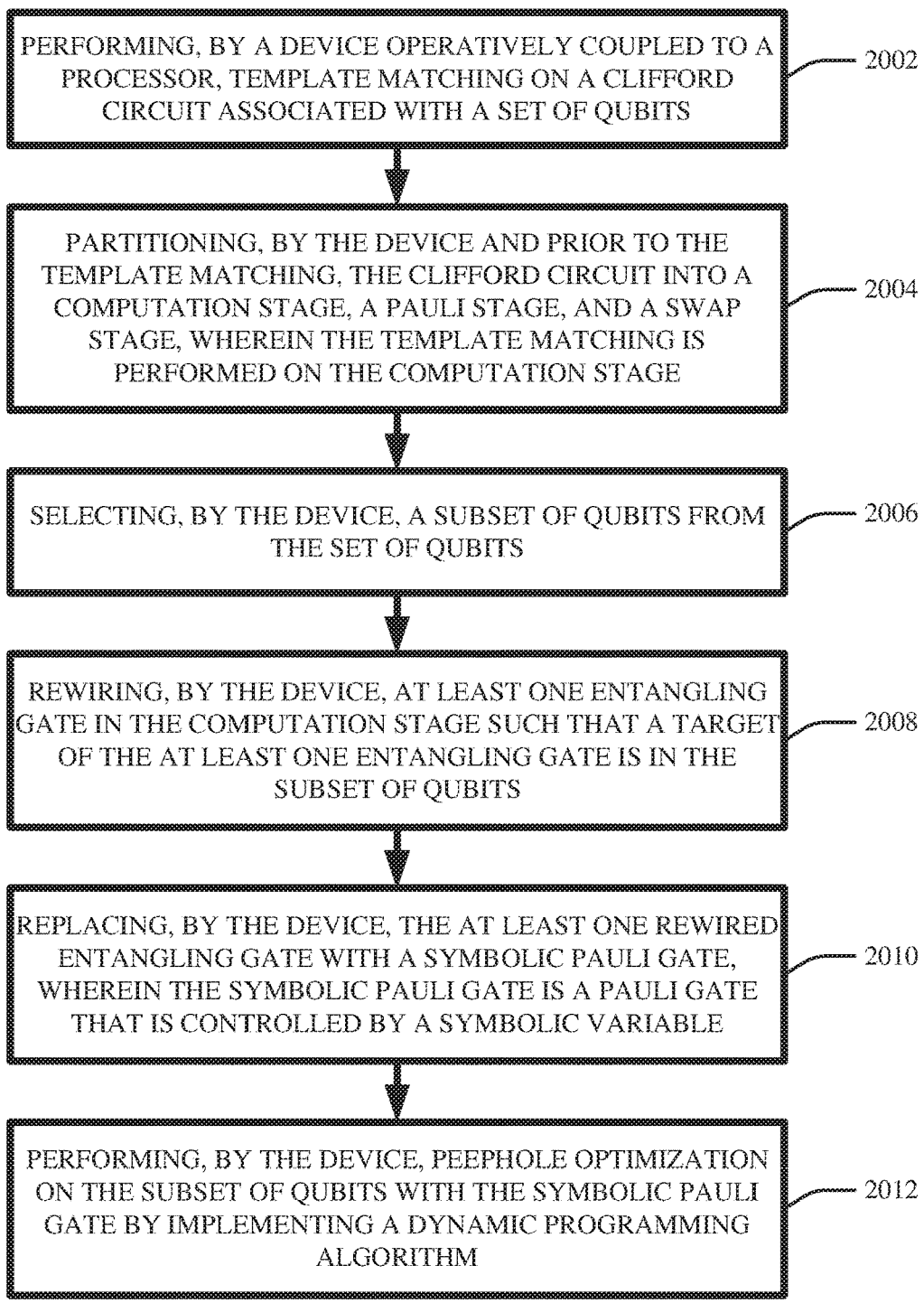
FIGS. 20-21 illustrate flow diagrams of example, non-limiting computer-implemented methods that facilitate partitioned template matching and/or symbolic peephole optimization in accordance with one or more embodiments described herein.
Figure 21:
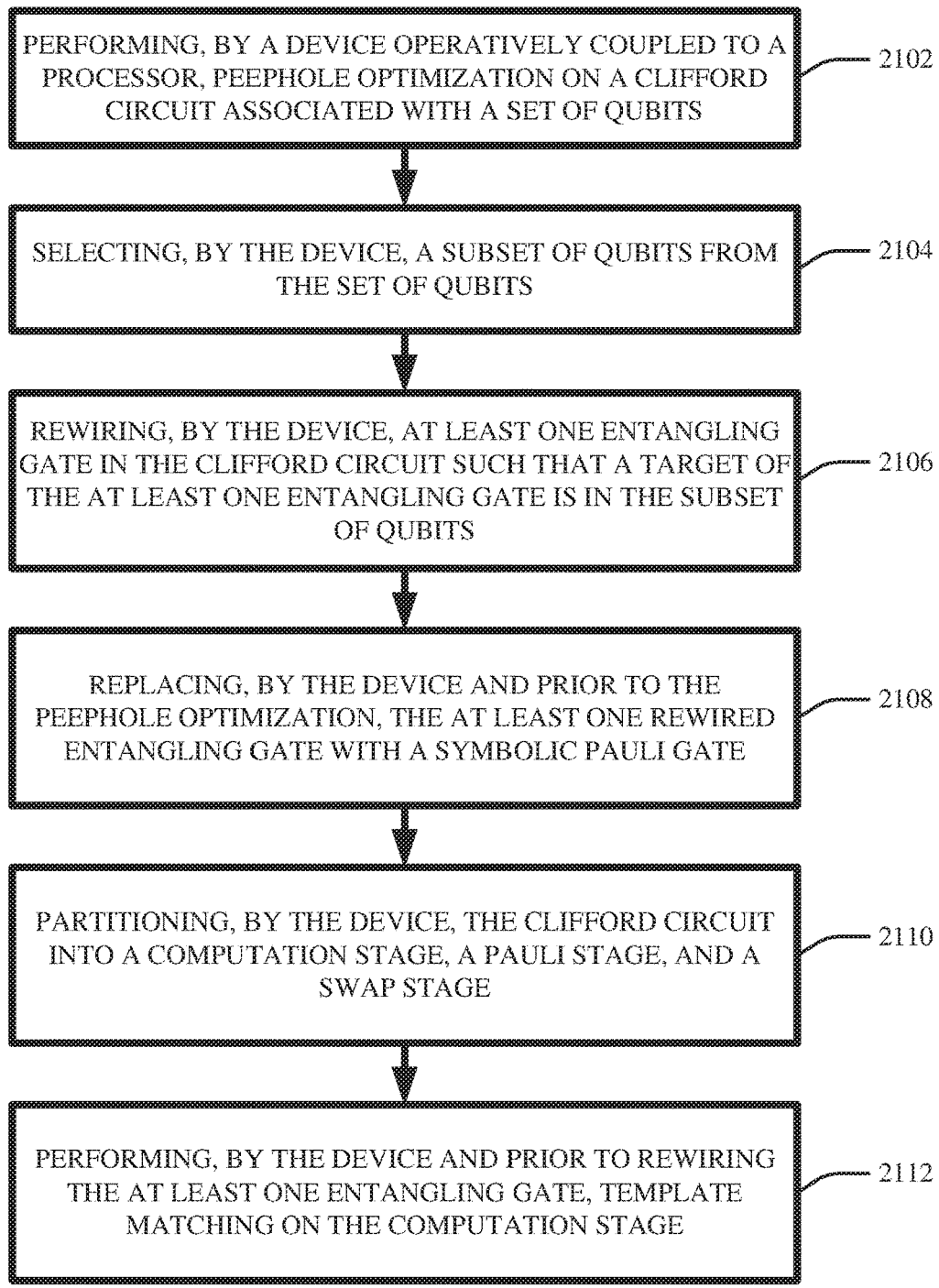

FIGS. 20-21 illustrate flow diagrams of example, non-limiting computer-implemented methods 2000 and 2100 that can facilitate partitioned template matching and/or symbolic peephole optimization in accordance with one or more embodiments described herein.

First, consider the computer-implemented method 2000. In various embodiments, act 2002 can include performing, by a device operatively coupled to a processor (e.g., 114), template matching on a Clifford circuit (e.g., 104) associated with a set of qubits.

In various aspects, act 2004 can include partitioning, by the device (e.g., 112) and prior to the template matching, the Clifford circuit into a computation stage (e.g., 502), a Pauli stage (e.g., 504), and a SWAP stage (e.g., 506), wherein the template matching can be performed on the computation stage (e.g., example of partitioning shown in FIG. 7).

In various instances, act 2006 can include selecting, by the device (e.g., 120), a subset of qubits (e.g., A) from the set of qubits.

In various cases, act 2008 can include rewiring, by the device (e.g., 120), at least one entangling gate (e.g., CNOT and/or CZ) in the computation stage such that a target of the at least one entangling gate is in the subset of qubits (e.g., via applying Hadamards as shown in FIG. 17).

In various aspects, act 2010 can include replacing, by the device (e.g., 120), the at least one rewired entangling gate with a symbolic Pauli gate (e.g., 1602), wherein the symbolic Pauli gate is a Pauli gate that is controlled by a symbolic variable (e.g., example of such replacement shown in FIG. 18).

In various instances, act 2012 can include performing, by the device (e.g., 122), peephole optimization on the subset of qubits with the symbolic Pauli gate (e.g., by leveraging the library of optimal circuits 1902) by implementing a dynamic programming algorithm. For the fixed set of qubits experiencing optimization by peephole, the optimization itself can be guided by the dynamic programming algorithm described above.

Although not shown in FIG. 20, the computer-implemented method 2000 can, in some cases, further include pushing, by the device (e.g., 116), a blocking gate (e.g., S in FIG. 13) out of a template matching range in the computation stage by replacing the blocking gate with a linear combination of Pauli operators.

Although not shown in FIG. 20, the computer-implemented method 2000 can, in some cases, further include re-partitioning, by the device (e.g., 112) the Clifford circuit when performance of template matching in the computation stage yields a Pauli gate or a SWAP gate in the computation stage.

Next, consider the computer-implemented method 2100. In various embodiments, act 2102 can include performing, by a device operatively coupled to a processor (e.g., 122), peephole optimization on a Clifford circuit (e.g., 104) associated with a set of qubits.

In various aspects, act 2104 can include selecting, by the device (e.g., 120), a subset of qubits from the set of qubits.

In various instances, act 2106 can include rewiring, by the device (e.g., 120), at least one entangling gate (e.g., CNOT and/or CZ) in the Clifford circuit such that a target of the at least one entangling gate is in the subset of qubits (e.g., via applying Hadamards as shown in FIG. 17).

In various cases, act 2108 can include replacing, by the device (e.g., 120) and prior to the peephole optimization, the at least one rewired entangling gate with a symbolic Pauli gate (e.g., 1602, example shown in FIG. 18).

In various aspects, act 2110 can include partitioning, by the device (e.g., 112), the Clifford circuit into a computation stage (e.g., 502), a Pauli stage (e.g., 504), and a SWAP stage (e.g., 506).

In various instances, act 2112 can include performing, by the device (e.g., 114) and prior to rewiring the at least one entangling gate, template matching on the computation stage.

Although not shown in FIG. 21, the computer-implemented method 2100 can, in some cases, further include pushing, by the device (e.g., 116), a blocking gate (e.g., S in FIG. 13) out of a template matching range in the computation stage by replacing the blocking gate with a linear combination of Pauli operators.

Although not shown in FIG. 21, the computer-implemented method 2100 can, in some cases, further include re-partitioning, by the device (e.g., 112) the Clifford circuit when performance of template matching in the computation stage yields a Pauli gate or a SWAP gate in the computation stage.

The inventors of the various embodiments of the invention conducted various experiments and/or numerical simulations, the results of which verify that embodiments of the invention outperform conventional Clifford optimization techniques. The experiments/simulations involved generating 993 uniformly sampled random Clifford unitaries with CNOT cost between 5 and 15. For cost from 5 to 14, the inventors considered 99 circuits for each cost value. For cost=15, there are only 3 Clifford circuits (modulo single-qubit Cliffords on the left and on the right and module qubit permutations). For each Clifford unitary, the inventors synthesized it using the baseline compiler described above and 9 randomized compilers, for a total of 10 different initial circuits. Then, optimization (e.g., partitioned template matching and symbolic peephole optimization) was performed on these 10 circuits and the best result was picked. The inventors found that the exactly optimal cost was achieved for 90.2% of the circuits, while on average introducing only about 1% of overhead in CNOT cost.

The inventors also applied the described optimization techniques to encoding circuits for Quantum Error-Correcting Codes (QECC) to see how embodiments of the invention would work for realistic, practically relevant circuits. The encoding circuits for QECC were obtained by starting with the stabilizer generators of the code and using a Clifford circuit synthesis algorithm to generate a corresponding circuit. Those circuits were recompiled using the baseline compiler, and then optimization (e.g., partitioned template matching and symbolic peephole optimization) was performed. The inventors found that the introduction of the floating gates technique resulted in an average improvement in two-qubit gate count of about 2.6% due to the additional template applications that were enabled by the floating gates technique. Moreover, average improvements of 64.5% over reference circuits and 35.4% over circuits synthesized using the baseline compiler were achieved. The inventors further noted that the quality of the improvement produced by various embodiments of the invention does not deteriorate with problem size (e.g., the improvement over baseline compiler is steady at about 35% even for with the number of qubits greater than 12). The inventors also found that the combined algorithms described herein can take mere seconds for small numbers of qubits (e.g., average runtime of 2.42 seconds for n=5) up to tens of minutes for large numbers of qubits.

Overall, various embodiments of the invention can be considered as two novel algorithms for Clifford circuit optimization: (1) partitioned template matching; and (2) symbolic peephole optimization. Partitioned template matching can be considered as a Clifford-specific extension of conventional template matching that leverages the unique properties of Cliffords to further reduce gate count. Specifically, partitioned template matching can include partitioning a Clifford circuit into three distinct stages (e.g., computation, Pauli, and SWAP), performing template matching on one of those distinct stages (e.g., computation), and eliminating SWAP gates via alignment with other two-qubit gates. Moreover, various embodiments of the invention can include a floating gates technique that can be used to remove blocking gates from desired template matching ranges. Symbolic peephole optimization can be considered as an improved version of peephole optimization which does not require complete decoupling to function. Specifically, symbolic peephole optimization can include identifying a desired subcircuit, rewiring any straddling gates such that their targets are in the subcircuit, and then replacing the rewired straddling gates with symbolic Pauli gates that are controlled by symbolic variables rather than by other qubits.

Throughout this disclosure, various variables, symbols, and/or mathematical notations are used to help describe embodiments of the invention. In some cases, a same variable/symbol can have different meanings when used in different portions of this description (e.g., in some places, i is used to denote an imaginary number, and in other places, i is used to denote an index; in some places, D is used to denote a particular algorithm and/or function, and in other places, D is used to denote a subset of qubits; in some cases C is used to denote various Clifford circuits and/or Clifford gate sets, and in other places, C is used to denote a subset of qubits; and so on). Those having ordinary skill in the art will appreciate that a same variable/symbol can have different meanings when used in different contexts/ways.

Figure 22:
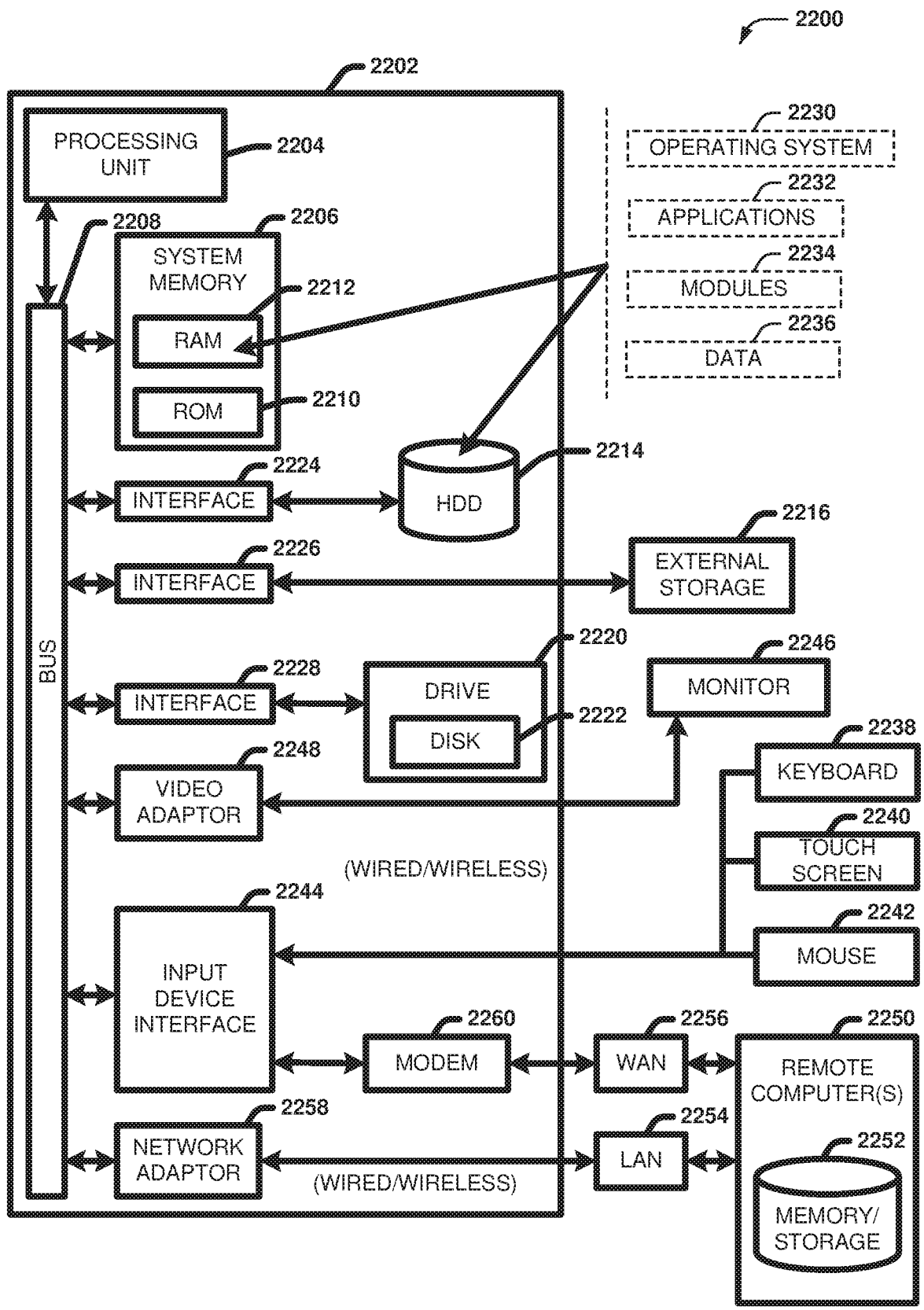
FIG. 22 illustrates a block diagram of an example, non-limiting operating environment in which one or more embodiments described herein can be facilitated.

In order to provide additional context for various embodiments described herein, FIG. 22 and the following discussion are intended to provide a brief, general description of a suitable computing environment 2200 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 22, the example environment 2200 for implementing various embodiments of the aspects described herein includes a computer 2202, the computer 2202 including a processing unit 2204, a system memory 2206 and a system bus 2208. The system bus 2208 couples system components including, but not limited to, the system memory 2206 to the processing unit 2204. The processing unit 2204 can be any of various commercially available processors. Dual microprocessors and other multi processor architectures can also be employed as the processing unit 2204.

The system bus 2208 can be any of several types of bus structure that can further interconnect to a memory bus (with or without a memory controller), a peripheral bus, and a local bus using any of a variety of commercially available bus architectures. The system memory 2206 includes ROM 2210 and RAM 2212. A basic input/output system (BIOS) can be stored in a non-volatile memory such as ROM, erasable programmable read only memory (EPROM), EEPROM, which BIOS contains the basic routines that help to transfer information between elements within the computer 2202, such as during startup. The RAM 2212 can also include a high-speed RAM such as static RAM for caching data.

The computer 2202 further includes an internal hard disk drive (HDD) 2214 (e.g., EIDE, SATA), one or more external storage devices 2216 (e.g., a magnetic floppy disk drive (FDD) 2216, a memory stick or flash drive reader, a memory card reader, etc.) and a drive 2220, e.g., such as a solid state drive, an optical disk drive, which can read or write from a disk 2222, such as a CD-ROM disc, a DVD, a BD, etc. Alternatively, where a solid state drive is involved, disk 2222 would not be included, unless separate. While the internal HDD 2214 is illustrated as located within the computer 2202, the internal HDD 2214 can also be configured for external use in a suitable chassis (not shown). Additionally, while not shown in environment 2200, a solid state drive (SSD) could be used in addition to, or in place of, an HDD 2214. The HDD 2214, external storage device(s) 2216 and drive 2220 can be connected to the system bus 2208 by an HDD interface 2224, an external storage interface 2226 and a drive interface 2228, respectively. The interface 2224 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2212, including an operating system 2230, one or more application programs 2232, other program modules 2234 and program data 2236. All or portions of the operating system, applications, modules, and/or data can also be cached in the RAM 2212. The systems and methods described herein can be implemented utilizing various commercially available operating systems or combinations of operating systems.

Computer 2202 can optionally comprise emulation technologies. For example, a hypervisor (not shown) or other intermediary can emulate a hardware environment for operating system 2230, and the emulated hardware can optionally be different from the hardware illustrated in FIG. 22. In such an embodiment, operating system 2230 can comprise one virtual machine (VM) of multiple VMs hosted at computer 2202. Furthermore, operating system 2230 can provide runtime environments, such as the Java runtime environment or the .NET framework, for applications 2232. Runtime environments are consistent execution environments that allow applications 2232 to run on any operating system that includes the runtime environment. Similarly, operating system 2230 can support containers, and applications 2232 can be in the form of containers, which are lightweight, standalone, executable packages of software that include, e.g., code, runtime, system tools, system libraries and settings for an application.

Further, computer 2202 can be enable with a security module, such as a trusted processing module (TPM). For instance, with a TPM, boot components hash next in time boot components, and wait for a match of results to secured values, before loading a next boot component. This process can take place at any layer in the code execution stack of computer 2202, e.g., applied at the application execution level or at the operating system (OS) kernel level, thereby enabling security at any level of code execution.

A user can enter commands and information into the computer 2202 through one or more wired/wireless input devices, e.g., a keyboard 2238, a touch screen 2240, and a pointing device, such as a mouse 2242. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2204 through an input device interface 2244 that can be coupled to the system bus 2208, but can be connected by other interfaces, such as a parallel port, an IEEE 1394 serial port, a game port, a USB port, an IR interface, a BLUETOOTH® interface, etc.

A monitor 2246 or other type of display device can be also connected to the system bus 2208 via an interface, such as a video adapter 2248. In addition to the monitor 2246, a computer typically includes other peripheral output devices (not shown), such as speakers, printers, etc.

The computer 2202 can operate in a networked environment using logical connections via wired and/or wireless communications to one or more remote computers, such as a remote computer(s) 2250. The remote computer(s) 2250 can be a workstation, a server computer, a router, a personal computer, portable computer, microprocessor-based entertainment appliance, a peer device or other common network node, and typically includes many or all of the elements described relative to the computer 2202, although, for purposes of brevity, only a memory/storage device 2252 is illustrated. The logical connections depicted include wired/wireless connectivity to a local area network (LAN) 2254 and/or larger networks, e.g., a wide area network (WAN) 2256. Such LAN and WAN networking environments are commonplace in offices and companies, and facilitate enterprise-wide computer networks, such as intranets, all of which can connect to a global communications network, e.g., the Internet.

When used in a LAN networking environment, the computer 2202 can be connected to the local network 2254 through a wired and/or wireless communication network interface or adapter 2258. The adapter 2258 can facilitate wired or wireless communication to the LAN 2254, which can also include a wireless access point (AP) disposed thereon for communicating with the adapter 2258 in a wireless mode.

When used in a WAN networking environment, the computer 2202 can include a modem 2260 or can be connected to a communications server on the WAN 2256 via other means for establishing communications over the WAN 2256, such as by way of the Internet. The modem 2260, which can be internal or external and a wired or wireless device, can be connected to the system bus 2208 via the input device interface 2244. In a networked environment, program modules depicted relative to the computer 2202 or portions thereof, can be stored in the remote memory/storage device 2252. It will be appreciated that the network connections shown are example and other means of establishing a communications link between the computers can be used.

When used in either a LAN or WAN networking environment, the computer 2202 can access cloud storage systems or other network-based storage systems in addition to, or in place of, external storage devices 2216 as described above, such as but not limited to a network virtual machine providing one or more aspects of storage or processing of information. Generally, a connection between the computer 2202 and a cloud storage system can be established over a LAN 2254 or WAN 2256 e.g., by the adapter 2258 or modem 2260, respectively. Upon connecting the computer 2202 to an associated cloud storage system, the external storage interface 2226 can, with the aid of the adapter 2258 and/or modem 2260, manage storage provided by the cloud storage system as it would other types of external storage. For instance, the external storage interface 2226 can be configured to provide access to cloud storage sources as if those sources were physically connected to the computer 2202.

The computer 2202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 23:
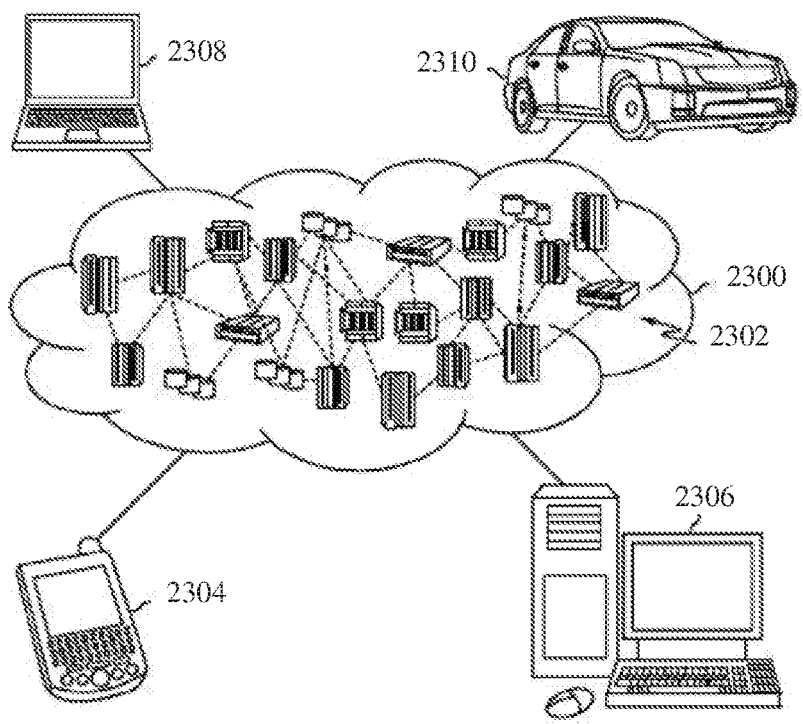
FIG. 23 illustrates an example, non-limiting cloud computing environment in accordance with one or more embodiments described herein.

Referring now to FIG. 23, illustrative cloud computing environment 2300 is depicted. As shown, cloud computing environment 2300 includes one or more cloud computing nodes 2302 with which local computing devices used by cloud consumers, such as, for example, personal digital assistant (PDA) or cellular telephone 2304, desktop computer 2306, laptop computer 2308, and/or automobile computer system 2310 may communicate. Nodes 2302 may communicate with one another. They may be grouped (not shown) physically or virtually, in one or more networks, such as Private, Community, Public, or Hybrid clouds as described hereinabove, or a combination thereof. This allows cloud computing environment 2300 to offer infrastructure, platforms and/or software as services for which a cloud consumer does not need to maintain resources on a local computing device. It is understood that the types of computing devices 2304-2310 shown in FIG. 23 are intended to be illustrative only and that computing nodes 2302 and cloud computing environment 2300 can communicate with any type of computerized device over any type of network and/or network addressable connection (e.g., using a web browser).

Figure 24:
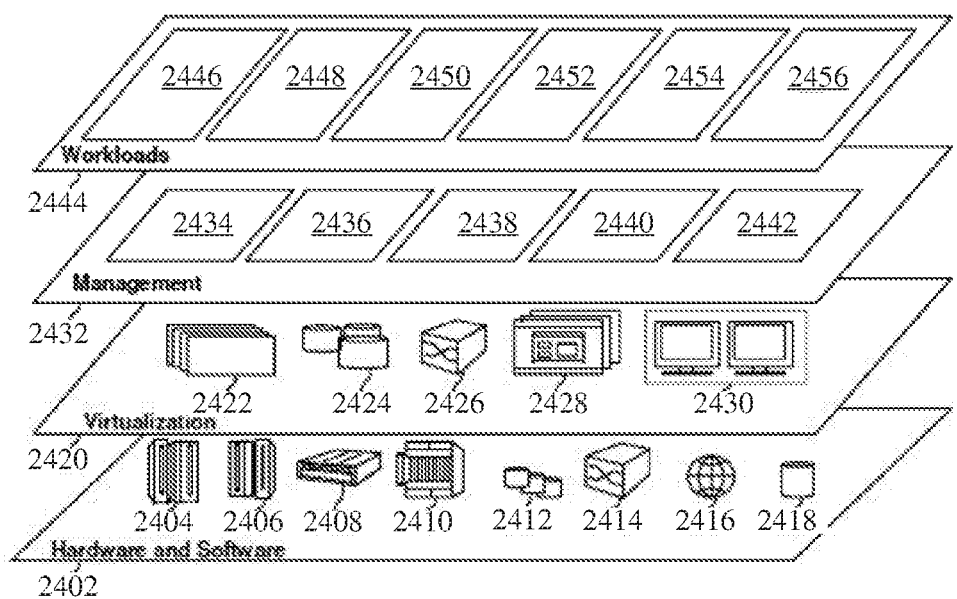
FIG. 24 illustrates example, non-limiting abstraction model layers in accordance with one or more embodiments described herein.

Referring now to FIG. 24, a set of functional abstraction layers provided by cloud computing environment 2300 (FIG. 23) is shown. Repetitive description of like elements employed in other embodiments described herein is omitted for sake of brevity. It should be understood in advance that the components, layers, and functions shown in FIG. 24 are intended to be illustrative only and embodiments of the invention are not limited thereto. As depicted, the following layers and corresponding functions are provided.

Hardware and software layer 2402 includes hardware and software components. Examples of hardware components include: mainframes 2404; RISC (Reduced Instruction Set Computer) architecture based servers 2406; servers 2408; blade servers 2410; storage devices 2412; and networks and networking components 2414. In some embodiments, software components include network application server software 2416 and database software 2418.

Virtualization layer 2420 provides an abstraction layer from which the following examples of virtual entities may be provided: virtual servers 2422; virtual storage 2424;

virtual networks 2426, including virtual private networks; virtual applications and operating systems 2428; and virtual clients 2430.

In one example, management layer 2432 may provide the functions described below. Resource provisioning 2434 provides dynamic procurement of computing resources and other resources that are utilized to perform tasks within the cloud computing environment. Metering and Pricing 2436 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 2438 provides access to the cloud computing environment for consumers and system administrators. Service level management 2440 provides cloud computing resource allocation and management such that required service levels are met. Service Level Agreement (SLA) planning and fulfillment 2442 provide pre-arrangement for, and procurement of, cloud computing resources for which a future requirement is anticipated in accordance with an SLA.

Workloads layer 2444 provides examples of functionality for which the cloud computing environment may be utilized. Examples of workloads and functions which may be provided from this layer include: mapping and navigation 2446; software development and lifecycle management 2448; virtual classroom education delivery 2450; data analytics processing 2452; transaction processing 2454; and differentially private federated learning processing 2456. Various embodiments of the present invention can utilize the cloud computing environment described with reference to FIGS. 23 and 24 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a processor that executes computer-executable components stored in a computer-readable memory, the computer-executable components comprising:
a template component that performs, using a library of templates comprising gates, template matching on a Clifford circuit associated with a set of qubits; and
a partition component that partitions, prior to the template matching, the Clifford circuit into a computation stage, a Pauli stage, and a SWAP stage, wherein the template matching is performed on the computation stage, and wherein:
the computation state comprises all Hadamard gates, all Phase gates, and all Controlled NOT gates of the Clifford circuit, and does not comprise any Pauli gates and any SWAP gates of the Clifford circuit;
the Pauli stage comprises all Pauli gates of the Clifford circuit, and does not comprise any Hadamard gates, any Phase gates, any Controlled NOT gates, and any SWAP gates of the Clifford circuit; and
the SWAP stage comprises all SWAP gates of the Clifford circuit, and does not comprise any Hadamard gates, any Phase gates, any Controlled NOT gates, and any Pauli gates of the Clifford circuit.

2. The system of claim 1, further comprising:
a floating component that pushes a blocking gate out of a template matching range in the computation stage by replacing the blocking gate with a linear combination of Pauli gates.

3. The system of claim 1, wherein the partition component re-partitions the Clifford circuit when performance of the template matching in the computation stage yields a Pauli gate or a SWAP gate in the computation stage.

4. The system of claim 1, further comprising:
a symbolic component that selects a subset of qubits from the set of qubits, rewires at least one entangling gate in the computation stage such that a target of the at least one entangling gate is in the subset of qubits, and replaces the at least one rewired entangling gate with a symbolic Pauli gate, wherein the symbolic Pauli gate is a Pauli gate that is controlled by a symbolic variable.

5. The system of claim 4, further comprising:
a peephole component that performs peephole optimization on the subset of qubits with the symbolic Pauli gate by implementing a dynamic programming algorithm.

6. The system of claim 1, wherein the template component, in response to determining that the Clifford circuit is optimized with respect to two-qubit gate count, restrict the template matching to a subset of the templates that can reduce single-qubit gate count without also reducing the two-bit gate count.

7. The system of claim 6, wherein the subset of the templates comprises single-qubit templates.

8. The system of claim 6, wherein the subset of the templates comprises templates with an even number of two-bit gates.

9. A computer-implemented method, comprising:
performing, by a device operatively coupled to a processor, using a library of templates comprising gates, template matching on a Clifford circuit associated with a set of qubits; and
partitioning, by the device and prior to the template matching, the Clifford circuit into a computation stage, a Pauli stage, and a SWAP stage, wherein the template matching is performed on the computation stage, and wherein:
the computation state comprises all Hadamard gates, all Phase gates, and all Controlled NOT gates of the Clifford circuit, and does not comprise any Pauli gates and any SWAP gates of the Clifford circuit;
the Pauli stage comprises all Pauli gates of the Clifford circuit, and does not comprise any Hadamard gates, any Phase gates, any Controlled NOT gates, and any SWAP gates of the Clifford circuit; and
the SWAP stage comprises all SWAP gates of the Clifford circuit, and does not comprise any Hadamard gates, any Phase gates, any Controlled NOT gates, and any Pauli gates of the Clifford circuit.

10. The computer-implemented method of claim 9, further comprising:
pushing, by the device, a blocking gate out of a template matching range in the computation stage by replacing the blocking gate with a linear combination of Pauli gates.

11. The computer-implemented method of claim 9, further comprising:
re-partitioning, by the device, the Clifford circuit when performance of the template matching in the computation stage yields a Pauli gate or a SWAP gate in the computation stage.

12. The computer-implemented method of claim 9, further comprising:
selecting, by the device, a subset of qubits from the set of qubits;
rewiring, by the device, at least one entangling gate in the computation stage such that a target of the at least one entangling gate is in the subset of qubits; and
replacing, by the device, the at least one rewired entangling gate with a symbolic Pauli gate, wherein the symbolic Pauli gate is a Pauli gate that is controlled by a symbolic variable.

13. The computer-implemented method of claim 12, further comprising:
performing, by the device, peephole optimization on the subset of qubits with the symbolic Pauli gate by implementing a dynamic programming algorithm.

14. The computer-implemented method of claim 9, wherein the performing the template matching comprises, in response to determining that the Clifford circuit is optimized with respect to two-qubit gate count, restricting the template matching to a subset of the templates that can reduce single-qubit gate count without also reducing the two-bit gate count.

15. The computer-implemented method of claim 14, wherein the subset of the templates comprises at least one of single-qubit templates or templates with an even number of two-bit gates.

16. A computer program product for facilitating partitioned template matching and symbolic peephole optimization, the computer program product comprising a non-transitory computer readable medium having program instructions embodied therewith, the program instructions executable by a processor to cause the processor to:
perform, by the processor, using a library of templates comprising gates, template matching on a Clifford circuit associated with a set of qubits; and
partition, by the processor and prior to the template matching, the Clifford circuit into a computation stage, a Pauli stage, and a SWAP stage, wherein the template matching is performed on the computation stage, and wherein:
the computation state comprises all Hadamard gates, all Phase gates, and all Controlled NOT gates of the Clifford circuit, and does not comprise any Pauli gates and any SWAP gates of the Clifford circuit;
the Pauli stage comprises all Pauli gates of the Clifford circuit, and does not comprise any Hadamard gates, any Phase gates, any Controlled NOT gates, and any SWAP gates of the Clifford circuit; and
the SWAP stage comprises all SWAP gates of the Clifford circuit, and does not comprise any Hadamard gates, any Phase gates, any Controlled NOT gates, and any Pauli gates of the Clifford circuit.

17. The computer program product of claim 16, wherein the program instructions are further executable to cause the processor to:
push, by the processor, a blocking gate out of a template matching range in the computation stage by replacing the blocking gate with a linear combination of Pauli gates.

18. The computer program product of claim 16, wherein the program instructions are further executable to cause the processor to:
re-partition, by the processor, the Clifford circuit when performance of the template matching in the computation stage yields a Pauli gate or a SWAP gate in the computation stage.

19. The computer program product of claim 16, wherein the program instructions are further executable to cause the processor to:
select, by the processor, a subset of qubits from the set of qubits;
rewire, by the processor, at least one entangling gate in the computation stage such that a target of the at least one entangling gate is in the subset of qubits; and
replace, by the processor, the at least one rewired entangling gate with a symbolic Pauli gate, wherein the symbolic Pauli gate is a Pauli gate that is controlled by a symbolic variable.

20. The computer program product of claim 19, wherein the program instructions are further executable to cause the processor to:
perform, by the processor, peephole optimization on the subset of qubits with the symbolic Pauli gate by implementing a dynamic programming algorithm.

* * * * *